US012650479B2

(12) United States Patent     (10) Patent No.:   US 12,650,479 B2

Li et al.     (45) Date of Patent:    Jun. 9, 2026

(54) MAGNETIC RESONANCE MULTI-CORE RADIO FREQUENCY COIL DEVICE AND CONTROL METHOD, AND MAGNETIC RESONANCE IMAGING SYSTEM

(71) Applicant: SHENZHEN INSTITUTES OF ADVANCED TECHNOLOGY, Shenzhen (CN)

(72) Inventors: Ye Li, Shenzhen (CN); Nan Li, Shenzhen (CN); Feng Du, Shenzhen (CN); Qiaoyan Chen, Shenzhen (CN); Chao Luo, Shenzhen (CN); Xin Liu, Shenzhen (CN); Hairong Zheng, Shenzhen (CN)

(73) Assignee: SHENZHEN INSTITUTES OF ADVANCED TECHNOLOGY, Shenzhen (CN)

( * ) Notice: Subject to any disclaimer, the term of this patent is extended or adjusted under 35 U.S.C. 154(b) by 195 days.

(21) Appl. No.: 18/686,014

(22) PCT Filed: Oct. 18, 2021

(86) PCT No.: PCT/CN2021/124406

§ 371 (c)(1),
(2) Date: Feb. 23, 2024

(87) PCT Pub. No.: WO2023/024229

PCT Pub. Date: Mar. 2, 2023

(65) Prior Publication Data

US 2025/0180681 A1     Jun. 5, 2025

(30) Foreign Application Priority Data

Aug. 23, 2021    (CN) ......................... 202110971909.1

(51) Int. Cl.
    *G01R 33/34*      (2006.01)
    *G01R 33/36*      (2006.01)

(52) U.S. Cl.
    CPC ... *G01R 33/34076* (2013.01); *G01R 33/3628* (2013.01)

(58) Field of Classification Search
    CPC .............. G01R 33/34; G01R 33/34046; G01R 33/34076

(Continued)

(56) References Cited

U.S. PATENT DOCUMENTS 6,420,871 B1    7/2002   Wong et al.
2007/0279061 A1   12/2007   Erickson et al.

(Continued)

FOREIGN PATENT DOCUMENTS

CN     101726714 A    6/2010
CN     110488211 A    11/2019

(Continued)

OTHER PUBLICATIONS

Okamoto; Translation of JP H0293387 A; Pub Apr. 4, 1990; Translated by EPO & Google (Year: 1990).*

(Continued)

*Primary Examiner* — Alesa Allgood
*Assistant Examiner* — Rahul Maini
(74) *Attorney, Agent, or Firm* — BOND, SCHOENECK & KING, PLLC; George R. McGuire

(57)        ABSTRACT

A magnetic resonance multi-core radio frequency coil device includes a first birdcage coil and a second birdcage coil coaxially nested. The first birdcage coil includes four first end rings arranged along an axial direction and multiple first leg structures. Each first leg structure is connected to the four first end rings. The second birdcage coil includes two second end rings arranged along the axial direction and (Continued)

multiple second leg structures. Each second leg structure is connected to the two second end rings. The first birdcage coil is configured to transmit and receive radio frequency energy at frequencies corresponding to three different nuclides. The second birdcage coil is configured to transmit and receive radio frequency energy at a frequency corresponding to a nuclide. The nuclides corresponding to the first birdcage coil are different from the nuclide corresponding to the second birdcage coil.

14 Claims, 11 Drawing Sheets

(58) Field of Classification Search
USPC ................................................. 324/307–315
See application file for complete search history.

(56) References Cited

U.S. PATENT DOCUMENTS

| | | |
|---|---|---|
| 2009/0134876 A1 | 5/2009 | Griswold et al. |
| 2010/0102817 A1 | 4/2010 | Saha |
| 2013/0314088 A1 | 11/2013 | Wiggins et al. |
| 2014/0097838 A1 | 4/2014 | Potter et al. |

FOREIGN PATENT DOCUMENTS

| | | | |
|---|---|---|---|
| CN | 111426997 A | | 7/2020 |
| CN | 212433380 U | | 1/2021 |
| JP | H0293387 A | * | 4/1990 |
| WO | 2023024229 A1 | | 3/2023 |

OTHER PUBLICATIONS

Sun et al.; Translation of CN 110488211; Pub Nov. 22, 2019; Translated by EPO & Google (Year: 2019).*
Fantasia et al.; "Numerical and workbench design of 2.35 T double-tuned (1H/23Na) nested RF birdcage coils suitable for animal size MRI"; Pub Jan. 2020; IEEE Transactions on Medical Imaging; vol. 39(10); pp. 1-12 (Year: 2020).*
Translated Chinese First Office Action, App. No. 202110971909.1, dated Mar. 28, 2022, pp. 1-10.
Translated International Search Report, Application No. PCT/CN2021/124406, prepared May 12, 2022, mailed May 20, 2022, pp. 1-6.
Wild, J. M., et al., "Simultaneous imaging of lung structure and function with tri-nuclear hybrid MRI", Radiology, 2013, 267(1), DOI:10.3874/j.issn.1674-1897.2013.04.r0422, DOI:10.1148/radiol. 12121153, pp. 251-255.

* cited by examiner

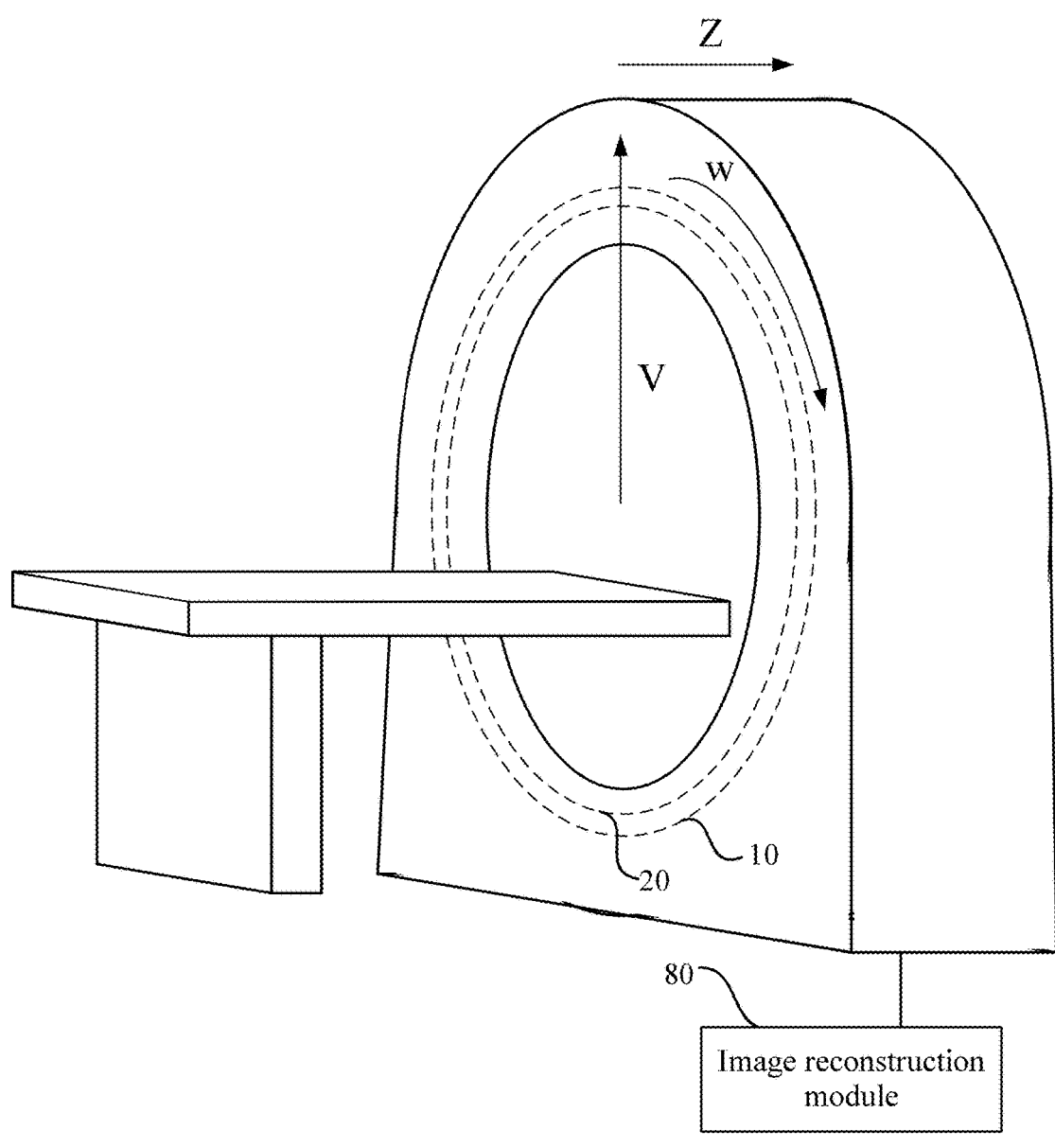

Image reconstruction module

FIG. 9

| In any scan cycle, a first birdcage coil transmits and receives radio frequency energy at frequencies corresponding to three different nuclides | S710 |

| In any scan cycle, a second birdcage coil transmits and receives radio frequency energy at a frequency corresponding to a nuclide, where the first birdcage coil and the second birdcage coil operate in a time-sharing manner | S720 |

FIG. 10

In any scan cycle, in the case where the first tuning and detuning control circuit controls the first birdcage coil to be in the tuned state, the first birdcage coil transmits and receives radio frequency energy at frequencies corresponding to three different nuclides; and the second tuning and detuning control circuit controls the second birdcage coil to be in the detuned state                                 S810

In any scan cycle, in the case where the second tuning and detuning control circuit controls the second birdcage coil to be in the tuned state, the second birdcage coil transmits and receives radio frequency energy at a frequency corresponding to a nuclide; and the first tuning and detuning control circuit controls the first birdcage coil to be in the detuned state                                 S820

FIG. 11

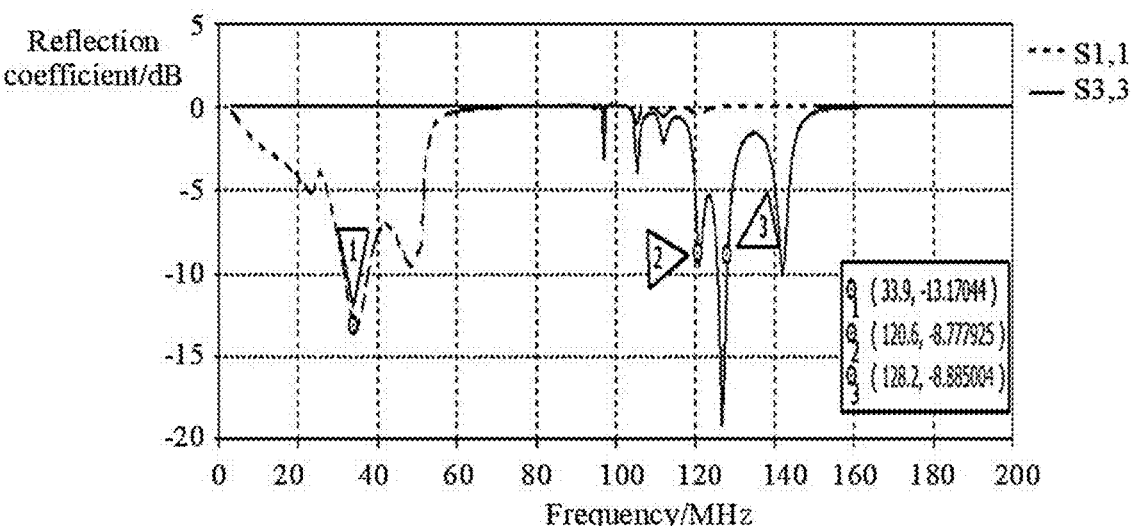

FIG. 12

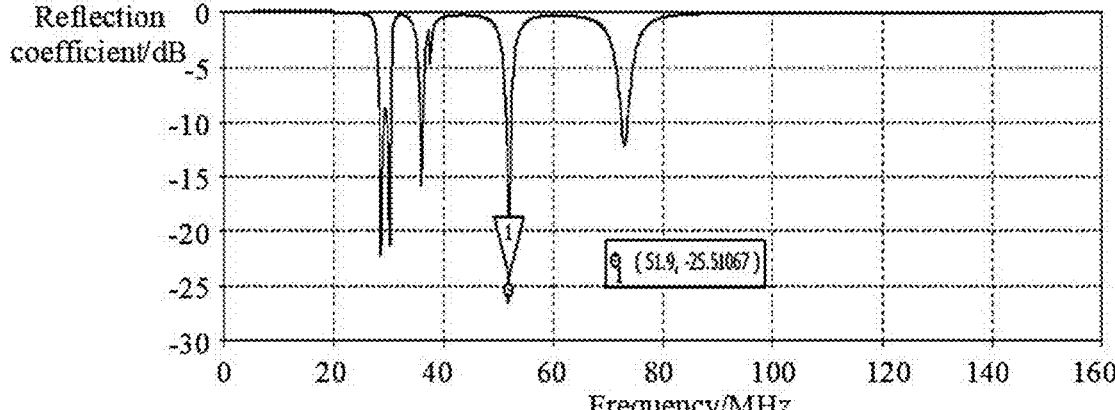

FIG. 13

MAGNETIC RESONANCE MULTI-CORE RADIO FREQUENCY COIL DEVICE AND CONTROL METHOD, AND MAGNETIC RESONANCE IMAGING SYSTEM

This is a National Stage Application, filed under 35 U.S.C.371 based on International Patent Application No. PCT/CN2021/124406, filed on Oct. 18, 2021, which claims priority to Chinese Patent Application No. 202110971909.1 filed on Aug. 23, 2021, the disclosures of which are incorporated herein by reference in their entireties.

TECHNICAL FIELD

The present application relates to the field of magnetic resonance technologies, for example, a magnetic resonance multi-core radio frequency coil device, a control method, and a magnetic resonance imaging system.

BACKGROUND

Magnetic resonance imaging (MRI) applies radio frequency pulses at a specific frequency to a scan object in a static magnetic field so that the nuclides in the scan object are excited, and thus a magnetic resonance phenomenon occurs. After the radio frequency pulses are stopped, the nuclides generate magnetic resonance (MR) signals during the relaxation process. Through the processes of receiving, spatial encoding, and image reconstruction of the MR signals, a magnetic resonance image of the scan object is generated.

Research on magnetic resonance imaging technologies has evolved from simply acquiring high-quality anatomical images to performing multi-core imaging and quantifying some physiological or pathological indicators such as 1H, 19F, 31P, 23Na, and 13C in tissues. Therefore, the biological information contained in the signal changes of multiple nuclides can be mined simultaneously, and multiple heterogeneous signal changes at different levels such as overexpression of tumor molecular targets, abnormal energy metabolism, ion disorders, and the structures and functions of organs and tissues can be analyzed qualitatively and quantitatively.

The acquisition of multi-core magnetic resonance imaging is mostly achieved by continuously changing coil devices to achieve multiple single-core collections and then registering the images collected by the multiple single-cores. This type of implementation is affected by the collection time and the positional movement and property changes of an imaging object, leading to inaccurate co-matching of signals (co-matching of signals is the matching of signals; for example' the imaging position of weak nuclide signals is acquired by first obtaining 1H structural imaging). This asynchrony leads to an increased image registration failure rate.

SUMMARY

Embodiments of the present application provide a magnetic resonance multi-core radio frequency coil device, a control method, and a magnetic resonance imaging system.

In a first aspect, an embodiment of the present application provides a magnetic resonance multi-core radio frequency coil device. The device includes a first birdcage coil and a second birdcage coil which are coaxially nested.

The first birdcage coil includes four first end rings arranged along an axial direction and multiple first leg structures extending along the axial direction and arranged along a circumferential direction; each first leg structure is connected to the four first end rings; the second birdcage coil includes two second end rings arranged along the axial direction and multiple second leg structures extending along the axial direction and arranged along the circumferential direction; and each second leg structure is connected to the two second end rings.

The first birdcage coil is configured to transmit and receive radio frequency energy at frequencies corresponding to three different nuclides; the second birdcage coil is configured to transmit and receive radio frequency energy at a frequency corresponding to a nuclide; and the nuclides corresponding to the first birdcage coil are different from the nuclide corresponding to the second birdcage coil.

In a second aspect, an embodiment of the present application further provides a magnetic resonance imaging system. The system includes the magnetic resonance multi-core radio frequency coil device provided in any embodiment of the present application.

In a third aspect, an embodiment of the present application further provides a control method based on the magnetic resonance multi-core radio frequency coil device provided in any embodiment of the present application. The control method includes the steps described below.

In any scan cycle, a first birdcage coil transmits and receives radio frequency energy at frequencies corresponding to three different nuclides.

In any scan cycle, a second birdcage coil transmits and receives radio frequency energy at a frequency corresponding to a nuclide, where the first birdcage coil and the second birdcage coil operate in a time-sharing manner.

In a fourth aspect, an embodiment of the present application provides a computer-readable storage medium, which stores computer programs for performing the control method described above when the computer programs are executed by a processor.

BRIEF DESCRIPTION OF DRAWINGS

FIG. 9 is a structural diagram of a magnetic resonance imaging system according to an embodiment of the present application;

FIG. 10 is a flowchart of a control method according to an embodiment of the present application;

FIG. 11 is a flowchart of another control method according to an embodiment of the present application;

FIG. 12 is an S parameter distribution diagram of 1H, 19F, and 23Na of a first birdcage coil according to an embodiment of the present application;

FIG. 13 is an S parameter distribution diagram of 31P of a second birdcage coil according to an embodiment of the present application;

DETAILED DESCRIPTION

The present application is described below in conjunction with drawings and embodiments.

Figure 1:
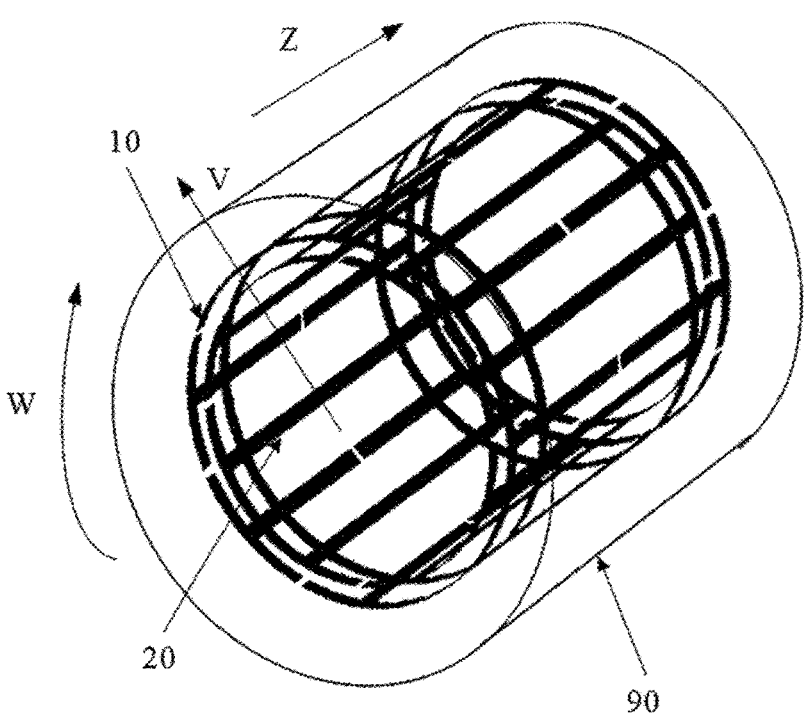
FIG. 1 is a structural diagram of a magnetic resonance multi-core radio frequency coil device according to an embodiment of the present application.
Figure 2:
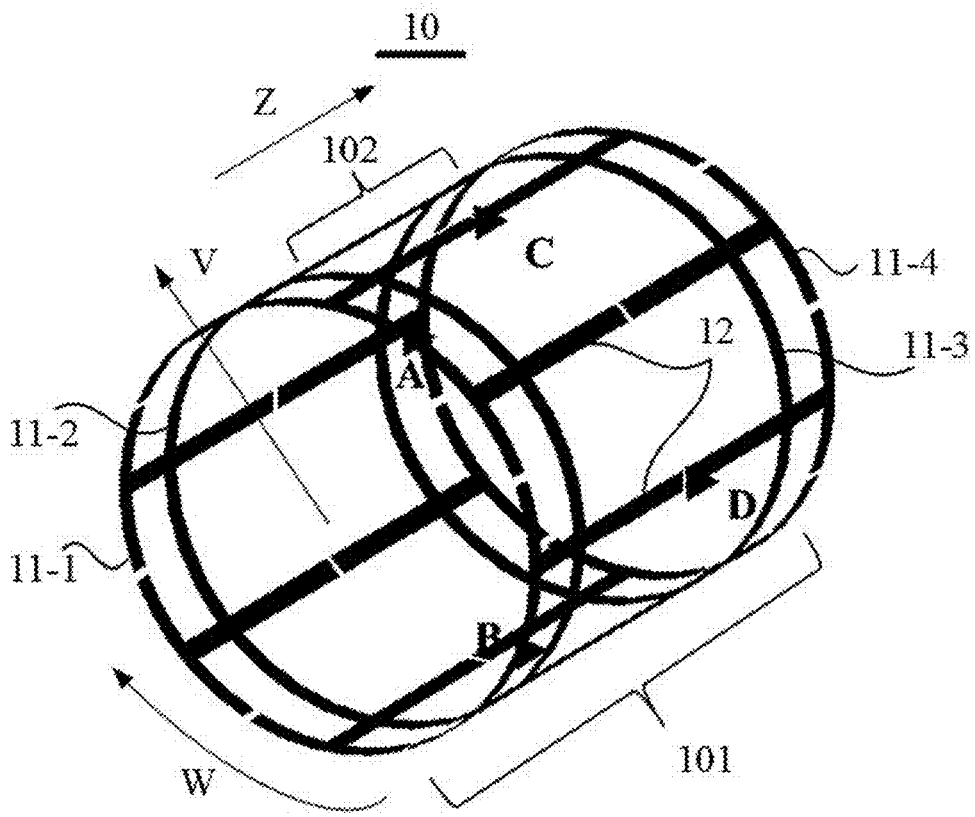
FIG. 2 is a structural diagram of a first birdcage coil according to an embodiment of the present application.
Figure 3:
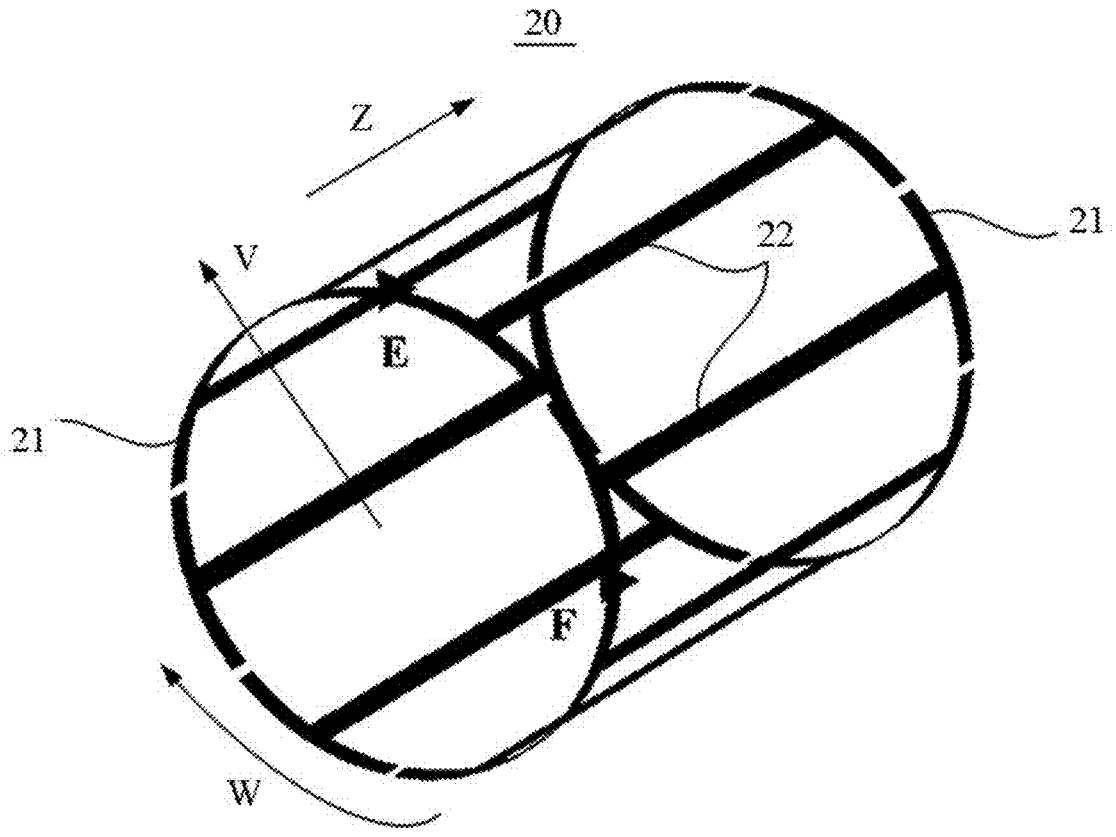
FIG. 3 is a structural diagram of a second birdcage coil according to an embodiment of the present application.

An embodiment of the present application provides a magnetic resonance multi-core radio frequency coil device. FIG. 1 is a structural diagram of a magnetic resonance multi-core radio frequency coil device according to an embodiment of the present application. FIG. 2 is a structural diagram of a first birdcage coil 10 according to an embodiment of the present application. FIG. 3 is a structural diagram of a second birdcage coil 20 according to an embodiment of the present application. The magnetic resonance multi-core radio frequency coil device is applicable to a magnetic resonance imaging system with any magnetic field strength. The magnetic resonance multi-core radio frequency coil device includes a first birdcage coil 10 and a second birdcage coil 20 coaxially nested.

The first birdcage coil 10 may be located inside the second birdcage coil 20, or the first birdcage coil 10 may be located outside the second birdcage coil 20. FIG. 1 illustrates a case where the first birdcage coil 10 is located outside the second birdcage coil 20.

In FIG. 2, the first birdcage coil 10 includes four first end rings 11 arranged along an axial direction Z and multiple first leg structures 12; and the multiple first leg structures 12 extend along the axial direction Z and are arranged along a circumferential direction W. Each first leg structure 12 of the multiple first leg structures 12 is connected to the four first end rings 11. V in FIG. 2 denotes a radial direction. The number of first leg structures 12 may be set as needed. The number of first leg structures 12 is 8, 16, or the like. The multiple first leg structures 12 may be arranged at equal intervals along the circumferential direction W. The four first end rings 11 may be arranged in parallel.

In FIG. 3, the second birdcage coil 20 includes two second end rings 21 arranged along the axial direction Z and multiple second leg structures 22; and the multiple second leg structures 22 extend along the axial direction Z and are arranged along the circumferential direction W. Each second leg structure 22 of the multiple second leg structures 22 is connected to the two second end rings 21. The number of second leg structures 22 may be set as needed. The number of second leg structures 22 may be 8, 16, or the like. The multiple second leg structures 22 may be arranged at equal intervals along the circumferential direction W. The two second end rings 21 may be arranged in parallel.

The first birdcage coil 10 is configured to transmit and receive radio frequency energy at frequencies corresponding to three different nuclides; the second birdcage coil 20 is configured to transmit and receive radio frequency energy at a frequency corresponding to a nuclide; and the nuclides corresponding to the first birdcage coil 10 are different from the nuclide corresponding to the second birdcage coil 20.

The first birdcage coil 10 and the second birdcage coil 20 form a double-layer nested birdcage integrated transceiver coil structure used for uniform excitation and collection of signals at the frequency required for four-nuclide imaging so that four resonant frequencies are provided simultaneously or synchronously, and images of four nuclides are acquired simultaneously or synchronously, thereby improving the four-nuclide imaging accuracy. The four nuclides may include any four of the following: 1H (hydrogen), 19F (fluorine), 23Na (sodium), 31P (phosphorus), 2H (deuterium), 13C (carbon), or the like. The first birdcage coil 10 may simultaneously transmit radio frequency energy at frequencies corresponding to the three different nuclides. The first birdcage coil 10 may simultaneously receive radio frequency energy at frequencies corresponding to the three different nuclides. In an embodiment, in FIG. 2, the four first end rings 11 include a first outer end ring 11-1, a first inner end ring 11-2, a second inner end ring 11-3, and a second outer end ring 11-4 arranged in sequence along the axial direction Z. The first outer end ring 11-1, the second outer end ring 11-4, and the first leg structures 12 between the first outer end ring 11-1 and the second outer end ring 11-4 form a first sub-birdcage coil 101. The first inner end ring 11-2, the second inner end ring 11-3, and a portion of each of the first leg structures 12 between the first inner end ring 11-2 and the second inner end ring 11-3 form a second sub-birdcage coil 102. Illustratively, the first sub-birdcage coil 101 is a high-pass birdcage coil, a low-pass birdcage coil, or a band-pass birdcage coil, which may be set as needed. Illustratively, the second sub-birdcage coil 102 may be a high-pass birdcage coil, a low-pass birdcage coil, or a band-pass birdcage coil, which may be set as needed. In an embodiment, the first sub-birdcage coil 101 is configured to transmit and receive radio frequency energy at the frequencies corresponding to two different nuclides; and the nuclide corresponding to the first sub-birdcage coil 101 and the nuclide corresponding to the second sub-birdcage coil 102 are different. In an embodiment, along the axial direction Z, by adjusting the distance between the two inner end rings (the first inner end ring 11-2 and the second inner end ring 11-3) of the first birdcage coil 10 and the distance between the inner end ring and the outer end ring that are adjacent, the interaction and electromagnetic interference between the signals corresponding to the three different nuclides may be reduced. In an embodiment, by adjusting the distance or angle at which the first leg structure 12 of the first birdcage coil 10 and the second leg structure 22 of the second birdcage coil 20 are staggered along the circumferential direction W, the electromagnetic interference between the inner birdcage coil and the outer birdcage coil may be reduced. In any scan cycle, the first birdcage coil 10 and the second birdcage coil 20 operate in a time-sharing manner so that the electromagnetic interference between the inner birdcage coil and the outer birdcage coil is reduced.

In this embodiment, the magnetic resonance multi-core radio frequency coil device includes a first birdcage coil and a second birdcage coil which are coaxially nested. The first birdcage coil includes four first end rings arranged along an axial direction and multiple first leg structures connected to the four first end rings, extending along the axial direction, and arranged along a circumferential direction. The second birdcage coil includes two second end rings arranged along the axial direction and multiple second leg structures connected to the two second end rings, extending along the axial direction, and arranged along the circumferential direction. The first birdcage coil is configured to transmit and receive radio frequency energy at frequencies corresponding to three different nuclides. The second birdcage coil is configured to transmit and receive radio frequency energy at a frequency corresponding to a nuclide. The nuclides corresponding to the first birdcage coil are different from the nuclide corresponding to the second birdcage coil. In this embodiment, the double-layer nested birdcage integrated transceiver coil structure is used for excitation and collection of signals at the frequency required for four-nuclide magnetic resonance imaging so that four resonant frequencies are provided simultaneously or synchronously, and images of four nuclides are acquired simultaneously or synchronously, thereby improving the four-nuclide imaging accuracy.

In FIG. 2, the first sub-birdcage coil 101 and the second sub-birdcage coil 102 can operate simultaneously. The body formed by the first sub-birdcage coil 101 and the second sub-birdcage coil 102 may simultaneously transmit radio frequency energy at frequencies corresponding to three different nuclides. After the transmission of the radio frequency energy stops, the whole coil formed by the first sub-birdcage coil 101 and the second sub-birdcage coil 102 may simultaneously receive the radio frequency energy at the frequencies corresponding to the three different nuclides. In an embodiment, The ratio of the length of the leg between the inner end rings to the length of the leg between the outer end rings of the first birdcage coil 10 and the distance between adjacent end rings are adjusted and optimized, so as to deal with the electromagnetic interference between the three different nuclides corresponding to the first birdcage coil 10.

Figure 4:
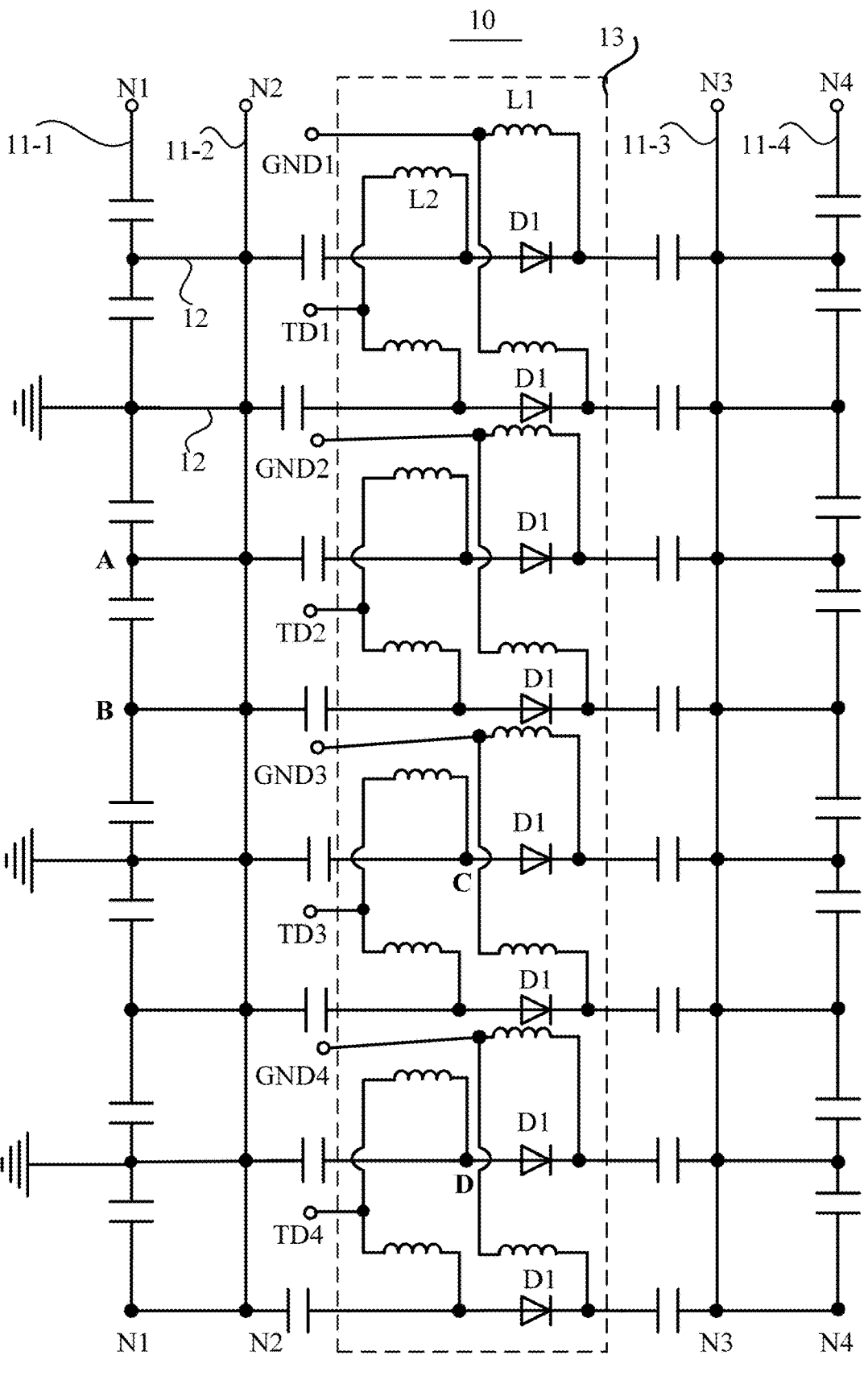
FIG. 4 is a structural diagram of an equivalent circuit of a first birdcage coil according to an embodiment of the present application.
Figure 5:
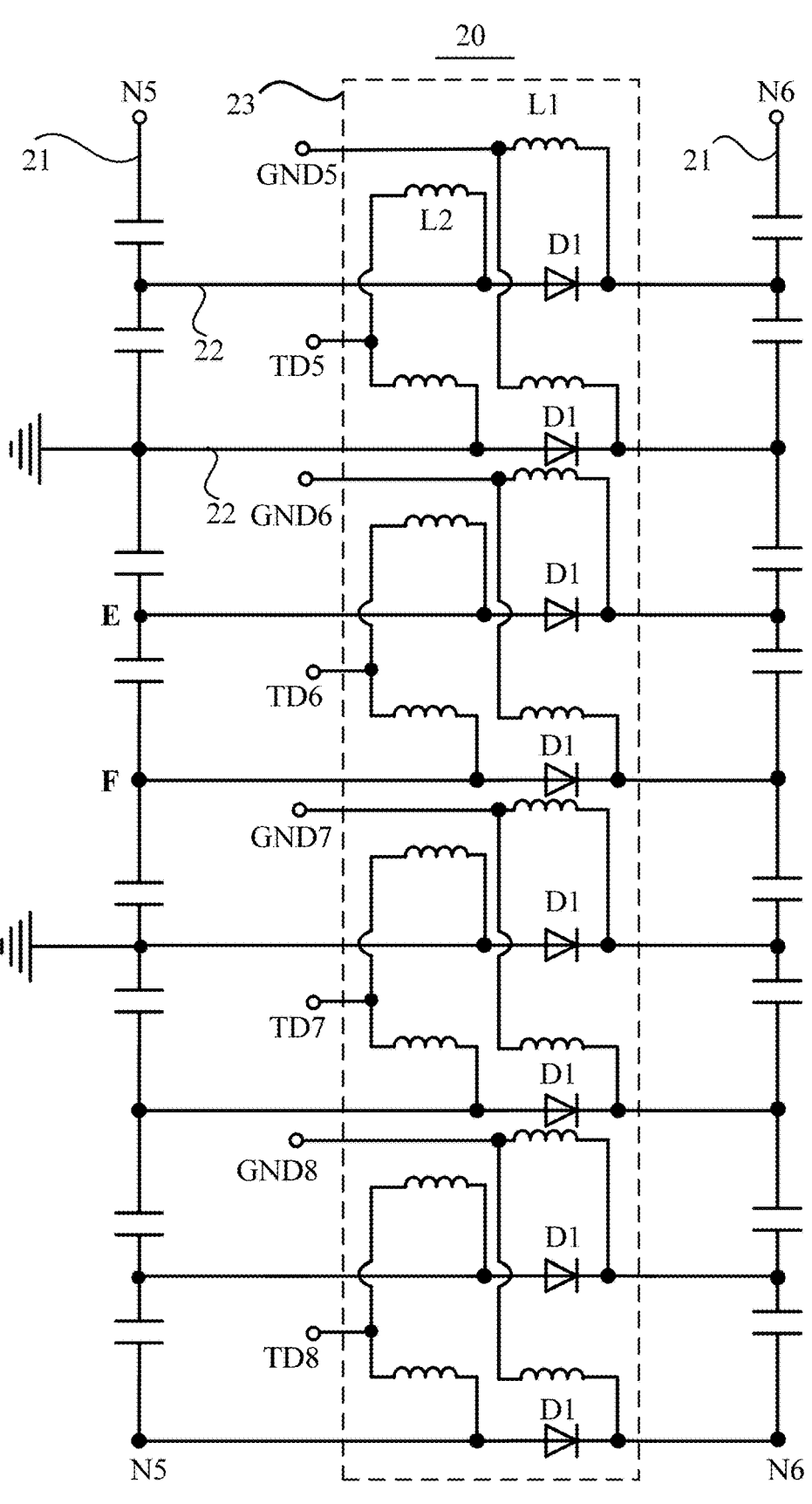
FIG. 5 is a structural diagram of an equivalent circuit of a second birdcage coil according to an embodiment of the present application.

In an embodiment, based on the preceding embodiment, FIG. 4 is a structural diagram of an equivalent circuit of the first birdcage coil 10 according to an embodiment of the present application, and FIG. 5 is a structural diagram of an equivalent circuit of the second birdcage coil 20 according to an embodiment of the present application. In FIGS. 4 and 5, the first birdcage coil 10 is provided with a first tuning and detuning control circuit 13; and the second birdcage coil 20 is provided with a second tuning and detuning control circuit 23.

In the case where the first tuning and detuning control circuit 13 is configured to control the first birdcage coil 10 to be in a tuned state, the second tuning and detuning control circuit 23 is configured to control the second birdcage coil 20 to be in a detuned state; and in the case where the second tuning and detuning control circuit 23 is configured to control the second birdcage coil 20 to be in the tuned state, the first tuning and detuning control circuit 13 is configured to control the first birdcage coil 10 to be in the detuned state, so as to reduce the electromagnetic interference between the inner birdcage coil and the outer birdcage coil.

In FIGS. 4 and 5, in the case where the second tuning and detuning control circuit 23 controls the second birdcage coil 20 to be in the detuned state (that is, the resonant frequency of the second birdcage coil 20 deviates from the working frequency) and the first tuning and detuning control circuit 13 controls the first birdcage coil 10 to be in the tuned state, the first birdcage coil 10 may simultaneously transmit the radio frequency energy at the frequencies corresponding to the three different nuclides. After stopping transmitting the radio frequency energy, the first birdcage coil 10 may simultaneously receive the radio frequency energy at the frequencies corresponding to the three different nuclides. In the embodiment of the present application, 1H, 19F, and 23Na are used as examples of the nuclides. In practical applications, the three nuclides may include different nuclides such as 1H, 2H, 19F, 23Na, 31P, and 13C. In the case where the first tuning and detuning control circuit 13 controls the first birdcage coil 10 to be in the detuned state (that is, the resonant frequency of the first birdcage coil 10 deviates from the working frequency), the first birdcage coil 10 cannot operate and cannot transmit and receive the radio frequency energy at the corresponding frequency.

In FIGS. 4 and 5, in the case where the first tuning and detuning control circuit 13 controls the first birdcage coil 10 to be in the detuned state and the second tuning and detuning control circuit 23 controls the second birdcage coil 20 to be in the tuned state, the second birdcage coil 20 may transmit radio frequency energy at a frequency corresponding to a nuclide. After stopping transmitting the radio frequency energy, the second birdcage coil 20 may receive the radio frequency energy at the frequency corresponding to the nuclide. In the embodiment of the present application, 31P is used as an example of the nuclide. In practical applications, the nuclide may include one of the different nuclides such as 1H, 2H, 19F, 23Na, 31P, or 13C. In the case where the second tuning and detuning control circuit 23 controls the second birdcage coil 20 to be in the detuned state, the second birdcage coil 20 cannot operate and cannot transmit and receive the radio frequency energy at the corresponding frequency.

In an embodiment, as shown in FIG. 4, the first tuning and detuning control circuit 13 may include a first diode D1 and two inductors L1 and L2 provided corresponding to the first leg structure 12. A cathode of the first diode D1 is grounded (GND1, GND2, GND3, or GND4 in FIG. 4) through the inductor L1; an anode of the first diode D1 is electrically connected to a control signal input terminal (TD1, TD2, TD3, or TD4 in FIG. 4) through the other inductor L2; and a high level or a low level is inputted into the control signal input terminal (TD1, TD2, TD3, or TD4 in FIG. 4), so as to control the first diode D1 to be turned on or off, thereby controlling the first birdcage coil 10 to be in the tuned state or the detuned state. For example, if the first diode D1 in the first tuning and detuning control circuit 13 is controlled to be turned on, the first birdcage coil 10 is in the detuned state; if the first diode D1 in the first tuning and detuning control circuit 13 is controlled to be turned off, the first birdcage coil 10 is in the tuned state. The first diode D1 in the first tuning and detuning control circuit 13 may be disposed on the first leg structure 12 between the first inner end ring 11-2 and the second inner end ring 11-3.

In an embodiment, as shown in FIG. 5, the second tuning and detuning control circuit 23 may include a first diode D1 and two inductors L1 and L2 provided corresponding to the second leg structure 22. A cathode of the first diode D1 is grounded (GND5, GND6, GND7, or GND8 in FIG. 5) through the inductor L1; an anode of the first diode D1 is electrically connected to a control signal input terminal (TD5, TD6, TD7, or TD8 in FIG. 5) through the other inductor L2; and a high level or a low level is inputted into the control signal input terminal (TD5, TD6, TD7, or TD8 in FIG. 5), so as to control the first diode D1 to be turned on or off, thereby controlling the second birdcage coil 20 to be in the tuned state or the detuned state. The first diode D1 in the second tuning and detuning control circuit 23 may be disposed on the second leg structure 22. For example, if the first diode D1 in the second tuning and detuning control circuit 23 is controlled to be turned on, the second birdcage coil 20 is in the detuned state; if the first diode D1 in the second tuning and detuning control circuit 23 is controlled to be turned off, the second birdcage coil 20 is in the tuned state.

The structure and working process of the second tuning and detuning control circuit 23 are the same as or similar to the structure and working process of the first tuning and detuning control circuit 13.

Electrical nodes with the same symbol are electrically connected, such as nodes N1, N2, N3, and N4 in FIG. 4 and nodes N5 and N6 in FIG. 5.

A high-pass birdcage coil may be formed by setting a capacitor on the end ring. A low-pass birdcage coil may be formed by setting a capacitor on the leg structure. A band-pass birdcage coil may be formed by setting capacitors on the end ring and the leg structure. For example, FIG. 4 illustrates the case where the first sub-birdcage coil 101 is the high-pass birdcage coil and the second sub-birdcage coil 102 is the low-pass birdcage coil. For example, FIG. 5 illustrates the case where the second birdcage coil 20 is the high-pass birdcage coil.

In an embodiment, the first sub-birdcage coil 101 is configured to transmit and receive radio frequency energy at frequencies corresponding to two different nuclides of the three different nuclides; the second sub-birdcage coil 102 is configured to transmit and receive radio frequency energy at a frequency corresponding to a nuclide of the three different nuclides; and the nuclides corresponding to the first sub-birdcage coil 101 are different from the nuclide corresponding to the second sub-birdcage coil 102.

Figure 6:
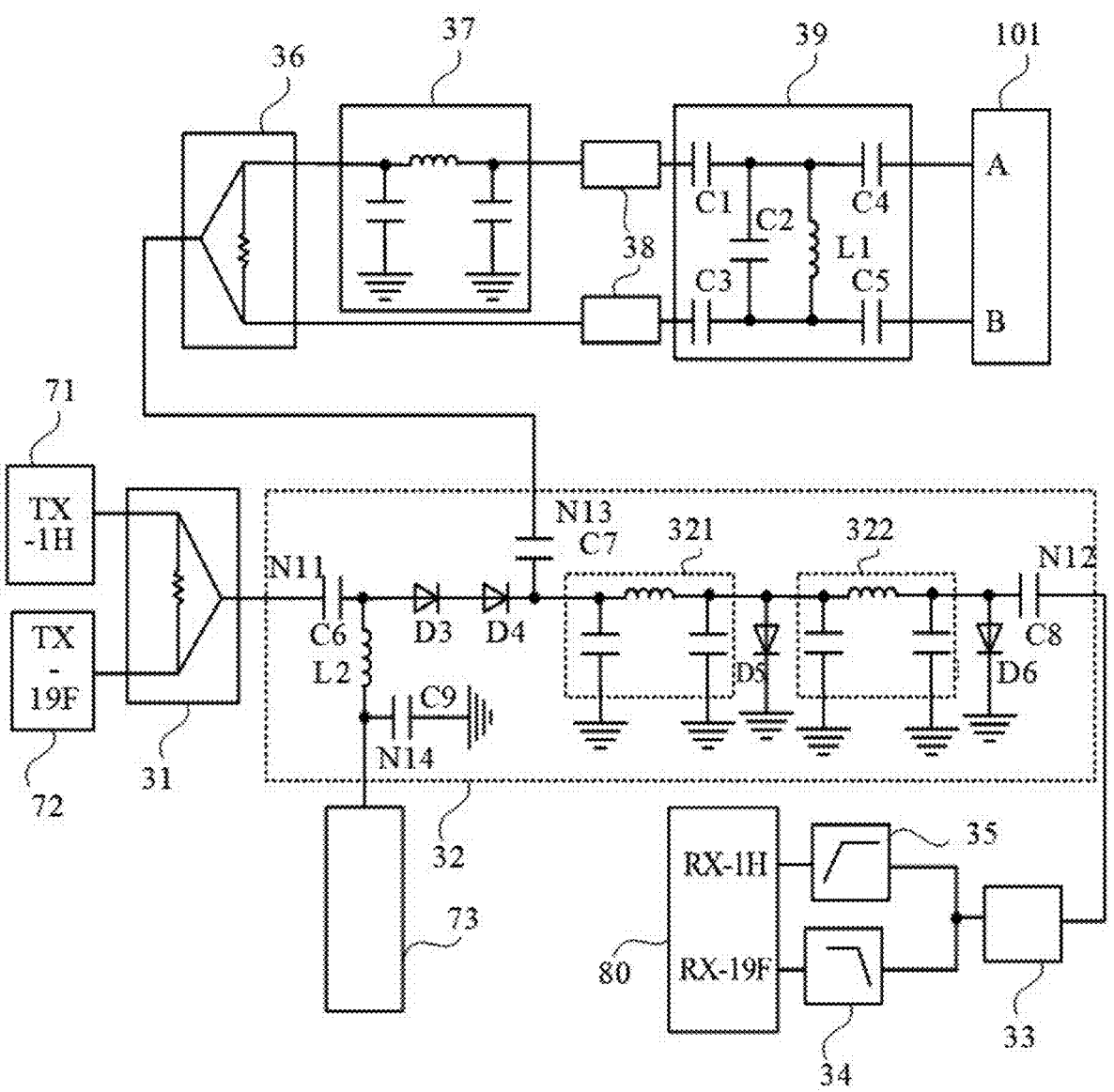
FIG. 6 is a schematic diagram of a circuit structure of a first front-end circuit according to an embodiment of the present application.

In an embodiment, based on the preceding embodiments, FIG. 6 is a schematic diagram of a circuit structure of a first front-end circuit according to an embodiment of the present application. The magnetic resonance multi-core radio frequency coil device further includes a first front-end circuit. The first front-end circuit includes a power combiner 31, a first transmitting and receiving mode switch 32, a first low-noise amplifier 33, a low-pass filter 34, a high-pass filter 35, a power divider 36, a 90-degree phase shifter 37, a first balun structure 38, and a double resonant circuit 39. The first front-end circuit in FIG. 6 is a birdcage coil that can transmit and receive radio frequency energy at frequencies corresponding to two different nuclides.

In FIG. 6, the power combiner 31 is configured to simultaneously receive excitation signals at frequencies corresponding to the two different nuclides; an output terminal of the power combiner 31 is electrically connected to a first terminal N11 of the first transmitting and receiving mode switch 32; a second terminal N12 of the first transmitting and receiving mode switch 32 is electrically connected to an input terminal of the first low-noise amplifier 33; a third terminal N13 of the first transmitting and receiving mode switch 32 is electrically connected to an input terminal of the power divider 36; a first output terminal of the power divider 36 is electrically connected to the first sub-birdcage coil 101 through the 90-degree phase shifter 37, the first balun structure 38, and the double resonant circuit 39 in sequence; a second output terminal of the power divider 36 is electrically connected to the first sub-birdcage coil 101 through the first balun structure 38 and the double resonant circuit 39 in sequence; an input terminal of the low-pass filter 34 and an input terminal of the high-pass filter 35 are separately electrically connected to an output terminal of the first low-noise amplifier 33; the low-pass filter 34 is configured to output a magnetic resonance signal of one nuclide of the two different nuclides; and the high-pass filter 35 is configured to output a magnetic resonance signal of the other nuclide of the two different nuclides.

In FIG. 6, the first front-end circuit can generate a quadrature excitation signal to the first sub-birdcage coil 101 in the case where the first sub-birdcage coil 101 is in a transmitting mode. The power combiner 31 may be configured to combine two signals inputted from two input terminals into one signal and output the combined signal. The power combiner 31 may include a Wilkinson power combiner. The power divider 36 may be configured to divide a signal inputted from the input terminal into two equally divided signals and separately output them to two output terminals (the first output terminal of the power divider 36 and the second output terminal of the power divider 36) in the case where the first sub-birdcage coil 101 is in the transmitting mode. The power divider 36 may include a Wilkinson power divider. The 90-degree phase shifter 37 can cause the phase of the signal outputted by the 90-degree phase shifter 37 to deviate from the phase of the signal inputted to the 90-degree phase shifter 37 by 90 degrees. The 90-degree phase shifter 37 may include a negative 90-degree phase shifter. The negative 90-degree phase shifter can cause the phase of the signal outputted by the negative 90-degree phase shifter to lag behind the phase of the signal inputted to the negative 90-degree phase shifter by 90 degrees. The first balun structure 38 can suppress common-mode interference. The double resonant circuit 39 may be configured to achieve accurate excitation and reception of signals at frequencies corresponding to two different nuclides and achieve dual-frequency matching, so as to deal with the electromagnetic interference between the two nuclides 1H and 19F. Two output terminals of the double resonant circuit 39 may be separately electrically connected to two quadrature excitation ports A and B of the first sub-birdcage coil 101. In an embodiment, by connecting the first terminal N11 and the third terminal N13 of the first transmitting and receiving mode switch 32 and disconnecting the second terminal N12 and the third terminal N13 of the first transmitting and receiving mode switch 32, the first sub-birdcage coil 101 enters the transmitting mode. In an embodiment, by disconnecting the first terminal N11 and the third terminal N13 of the first transmitting and receiving mode switch 32, and connecting the second terminal N12 and the third terminal N13 of the first transmitting and receiving mode switch 32, the first sub-birdcage coil 101 enters a receiving mode.

A first input terminal of the power combiner 31 may be electrically connected to an output terminal TX-1H of a first excitation signal source 71; and a second input terminal of the power combiner 31 may be electrically connected to an output terminal TX-19F of a second excitation signal source 72. A control circuit 73 may be electrically connected to a fourth terminal N14 of the first transmitting and receiving mode switch 32. An image reconstruction module 80 may be separately electrically connected to an output terminal of the low-pass filter 34 and an output terminal of the high-pass filter 35.

In an embodiment, the control circuit 73 is a transmitting terminal (TR terminal) configured to input high and low levels; the image reconstruction module 80 is a receiving terminal (RX terminal) configured to output the magnetic resonance signal. The control circuit 73 and the image reconstruction module 80 both represent ports.

In an embodiment, the image reconstruction module 80 may be connected to an image reconstruction system of a computer.

In conjunction with FIGS. 6 and 4, to make the first sub-birdcage coil 101 transmit radio frequency energy, two excitation signals outputted by the output terminal TX-1H of the first excitation signal source 71 and the output terminal TX-19F of the second excitation signal source 72 are combined into one signal by the power combiner 31, then the combined signal enters the first transmitting and receiving mode switch 32, the control circuit 73 inputs a high level such as +5V to the fourth terminal N14 of the first transmitting and receiving mode switch 32 to control the diodes (D3, D4, D5, and D6 in FIG. 6) in the first transmitting and receiving mode switch 32 to be turned on, so that the first terminal N11 and the third terminal N13 of the first transmitting and receiving mode switch 32 are connected and the second terminal N12 and the third terminal N13 of the first transmitting and receiving mode switch 32 are disconnected. The signal outputted by the power combiner 31 is transmitted to the third terminal N13 through the first terminal N11 of the first transmitting and receiving mode switch 32. In this case, the power divider 36 is used to divide the input signal into two; one signal is inputted into the 90-degree phase shifter 37 and then deviates from the other signal by 90 degrees, forming two quadrature excitation signals. After the two quadrature excitation signals passing through the first balun structure 38 and the double resonant circuit 39, the two quadrature excitation signals enter the two quadrature excitation ports A and B of the resonator of the first birdcage coil 10 of the four-terminal ring, for example, for achieving a quadrature excitation mode of the 1H/19F high-pass birdcage structure. To make the first sub-birdcage coil 101 receive radio frequency energy, the control circuit 73 inputs a low level such as −30V to the fourth terminal N14 of the first transmitting and receiving mode switch 32 to control the diodes (D3, D4, D5, and D6 in FIG. 6) in the first transmitting and receiving mode switch 32 to be turned off, so that the first terminal N11 and the third terminal N13 of the first transmitting and receiving mode switch 32 are disconnected and the second terminal N12 and the third terminal N13 are connected. The MRI signal comes out of the first birdcage coil 10 and passes through the phase shifters (for example, a second phase shifter 321 and a third phase shifter 322) in the first transmitting and receiving mode switch (TR-Switch) 32, and the magnetic resonance signal is amplified by the first low-noise amplifier 33 and then transmitted to the RX-19F terminal and the RX-1H terminal of the image reconstruction module 80 through the low-pass filter 34 and the high-pass filter 35 separately, thereby completing image reconstruction.

The low-pass filter 34 and the high-pass filter 35 represent the imaging loads (the nuclide signals of the phantom, the tissue, or the organ). The types of the nuclides outputted by the low-pass filter 34 and the high-pass filter 35 are different.

Based on the preceding embodiments, in an embodiment, the first sub-birdcage coil 101 is configured to transmit and receive radio frequency energy at frequencies corresponding to 1H and 19F; the second sub-birdcage coil 102 is configured to transmit and receive radio frequency energy at a frequency corresponding to 23Na; and the second birdcage coil 20 is configured to transmit and receive radio frequency energy at a frequency corresponding to 31P.

The frequency corresponding to 1H may be 128.2 MHz. The frequency corresponding to 19F may be 120.9 MHZ.

The frequency corresponding to 23Na may be 33.9 MHz. The frequency corresponding to 31P may be 51.9 MHz. Since the difference between the frequency corresponding to 1H and the frequency corresponding to 19F is relatively small and the bandwidth is relatively small, it is easy to achieve dual-frequency matching through hardware. Therefore, the first sub-birdcage coil 101 may be configured to be a dual core coil and configured to transmit and receive radio frequency energy at frequencies corresponding to 1H and 19F. The difference between the frequency corresponding to 23Na and the frequency corresponding to 31P is relatively large and the bandwidth is relatively large, making it difficult to achieve dual-frequency matching through hardware.

Based on the preceding embodiments, in an embodiment, with continued reference to FIG. 6, the double resonant circuit 39 may include a first capacitor C1, a second capacitor C2, a third capacitor C3, a first inductor L1, a fourth capacitor C4, and a fifth capacitor C5. A first terminal of the double resonant circuit 39 is electrically connected to a first terminal of the second capacitor C2 through the first capacitor C1; a second terminal of the double resonant circuit 39 is electrically connected to a second terminal of the second capacitor C2 through the third capacitor C3; the second capacitor C2 is connected in parallel with the first inductor L1; a third terminal of the double resonant circuit 39 is electrically connected to the first terminal of the second capacitor C2 through the fourth capacitor C4; and a fourth terminal of the double resonant circuit 39 is electrically connected to a second terminal of the fifth capacitor C5 through the third capacitor C3. The first output terminal of the power divider 36 is electrically connected to the first terminal of the double resonant circuit 39 through the 90-degree phase shifter 37 and the first balun structure 38 in sequence; the third terminal and the fourth terminal of the double resonant circuit 39 are electrically connected to the two quadrature excitation ports A and B of the first sub-birdcage coil 101, respectively; and the second output terminal of the power divider 36 is electrically connected to the second terminal of the double resonant circuit 39 through the first balun structure 38.

Based on the preceding embodiments, in an embodiment, with continued reference to FIG. 6, the first transmitting and receiving mode switch 32 may include a sixth capacitor C6, a seventh capacitor C7, an eighth capacitor C8, a ninth capacitor C9, a second inductor L2, the second phase shifter 321, the third phase shifter 322, a third diode D3, a fourth diode D4, a fifth diode D5, and a sixth diode D6. The first terminal N11 of the first transmitting and receiving mode switch 32 is electrically connected to a first terminal of the sixth capacitor C6; a second terminal of the sixth capacitor C6 is electrically connected to the fourth terminal N14 of the first transmitting and receiving mode switch 32 through the second inductor L2; the fourth terminal N14 of the first transmitting and receiving mode switch 32 is grounded through the ninth capacitor C9; the second terminal of the sixth capacitor C6 is electrically connected to a first terminal of the seventh capacitor C7 through the third diode D3 and the fourth diode D4 connected in series; a second terminal of the seventh capacitor C7 is electrically connected to the third terminal N13 of the first transmitting and receiving mode switch 32; the first terminal of the seventh capacitor C7 is electrically connected to an anode of the fifth diode D5 through the second phase shifter 321; a cathode of the fifth diode D5 is grounded; the second terminal N12 of the first transmitting and receiving mode switch 32 is electrically connected to a first terminal of the eighth capacitor C8; a second terminal of the eighth capacitor C8 is electrically connected to the anode of the fifth diode D5 through the third phase shifter 322; and the second terminal of the eighth capacitor C8 is grounded through the sixth diode D6.

Figure 7:
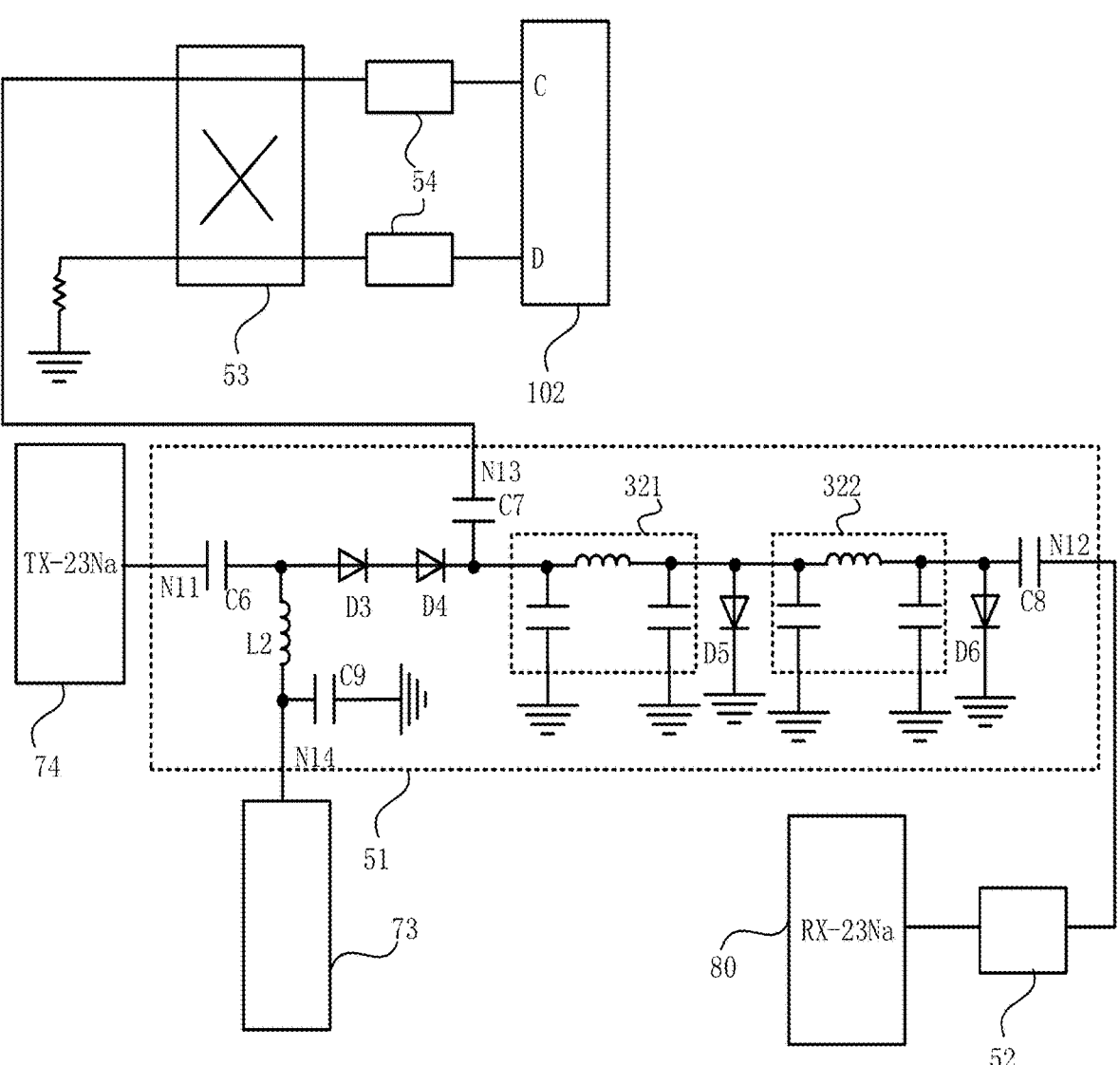
FIG. 7 is a schematic diagram of a circuit structure of a second front-end circuit according to an embodiment of the present application.

Based on the preceding embodiments, in an embodiment, FIG. 7 is a schematic diagram of a circuit structure of a second front-end circuit according to an embodiment of the present application. The magnetic resonance multi-core radio frequency coil device further includes a second front-end circuit. The second front-end circuit includes a second transmitting and receiving mode switch 51, a second low-noise amplifier 52, a first quadrature power divider (the quadrature power divider may also be recorded as the 90-degree quadrature power divider) 53, and a second balun structure 54. The second front-end circuit in FIG. 7 is a birdcage coil that can transmit and receive radio frequency energy at a frequency corresponding to a nuclide.

A first terminal of the second transmitting and receiving mode switch 51 is configured to receive an excitation signal at a frequency corresponding to the nuclide corresponding to the second sub-birdcage coil 102; a second terminal of the second transmitting and receiving mode switch 51 is electrically connected to an input terminal of the second low-noise amplifier 52; a third terminal of the second transmitting and receiving mode switch 51 is electrically connected to an input terminal of the first quadrature power divider 53; two output terminals of the first quadrature power divider 53 are electrically connected to the second sub-birdcage coil 102 through the second balun structure 54; and the second low-noise amplifier 52 is configured to output a magnetic resonance signal of the nuclide corresponding to the second sub-birdcage coil 102.

In an embodiment, by connecting the first terminal N11 and the third terminal N13 of the second transmitting and receiving mode switch 51 and disconnecting the second terminal N12 and the third terminal N13 of the second transmitting and receiving mode switch 51, the second sub-birdcage coil 102 enters the transmitting mode. In an embodiment, by disconnecting the first terminal N11 and the third terminal N13 of the second transmitting and receiving mode switch 51, and connecting the second terminal N12 and the third terminal N13 of the second transmitting and receiving mode switch 51, the second sub-birdcage coil 102 enters the receiving mode. In the case where the second sub-birdcage coil 102 is in the transmitting mode, the first quadrature power divider 53 can convert one signal inputted into the first quadrature power divider 53 into two equally divided signals with a phase difference of 90 degrees and output the two equally divided signals. The two output terminals of the first quadrature power divider 53 are separately electrically connected to two quadrature excitation ports C and D of the second sub-birdcage coil 102 through the second balun structure 54.

In an embodiment, the first terminal of the second transmitting and receiving mode switch 51 may be electrically connected to an output terminal TX-23Na of a third excitation signal source 74. The control circuit 73 may be electrically connected to a fourth terminal N14 of the second transmitting and receiving mode switch 51.

In conjunction with FIGS. 7 and 4, to make the second sub-birdcage coil 102 transmit radio frequency energy (the second sub-birdcage coil 102 is in the transmitting mode), the control circuit 73 may input a high level such as +5V to the fourth terminal N14 of the second transmitting and receiving mode switch 51, and the diodes D3 and D4 in the second transmitting and receiving mode switch 51 is turned on so that the first terminal N11 and the third terminal N13 of the second transmitting and receiving mode switch 51 are connected and the second terminal N12 and the third terminal N13 are disconnected. At the same time, the 23Na excitation signal comes out from the third excitation signal source 74, enters the second transmitting and receiving mode switch 51, passes through the first terminal N11 of the second transmitting and receiving mode switch 51, is transmitted to the third terminal N13, and enters the first quadrature power divider 53 so that the excitation signal generates two equally divided input signals with a phase difference of 90 degrees to form two quadrature excitation signals, and the two quadrature excitation signals separately enter the excitation ports C and D of the second sub-birdcage coil 102, thereby achieving low-pass 23Na birdcage quadrature excitation. To make the second sub-birdcage coil 102 receive radio frequency energy, the control circuit 73 may input a low level such as −30V to the fourth terminal N14 of the second transmitting and receiving mode switch 51, the diodes D3 and D4 in the second transmitting and receiving mode switch 51 is turned off, the MRI signal comes out from the resonator of the 23Na birdcage coil (the second sub-birdcage coil) 102, the magnetic resonance signal is amplified through the second low-noise amplifier 52, and the amplified magnetic resonance signal is transmitted to a receiving terminal RX-23Na of the image reconstruction module 80, thereby completing image reconstruction. In an embodiment, by adjusting the capacitance of the capacitor on the first leg structure 12, the second sub-birdcage coil 102 may be made to resonate to the 23Na working frequency (33.9 MHZ) in a system with a magnetic field strength of 3T. In an embodiment, the wire width and length of the end rings and legs of the second sub-birdcage coil 102 may be adjusted and optimized to ensure optimal emission field uniformity and high emissivity at the target frequency.

In an embodiment, the control signal input terminal (TD1, TD2, TD3, or TD4 in FIG. 4) of the first tuning and detuning control circuit 13 may be electrically connected to the control circuit 73. The first tuning and detuning control circuit 13 is introduced on the second sub-birdcage coil 102 (for example, the 23Na birdcage coil) and is controlled by the control signal input terminals TD1 to TD4 in FIG. 4. When a voltage of +5V is inputted into TD1, TD2, TD3, and TD4, the diode on the corresponding first leg structure 12 is turned on, and the resonant frequencies of the three nuclides deviate, thereby detuning the first birdcage coil 10.

Figure 8:
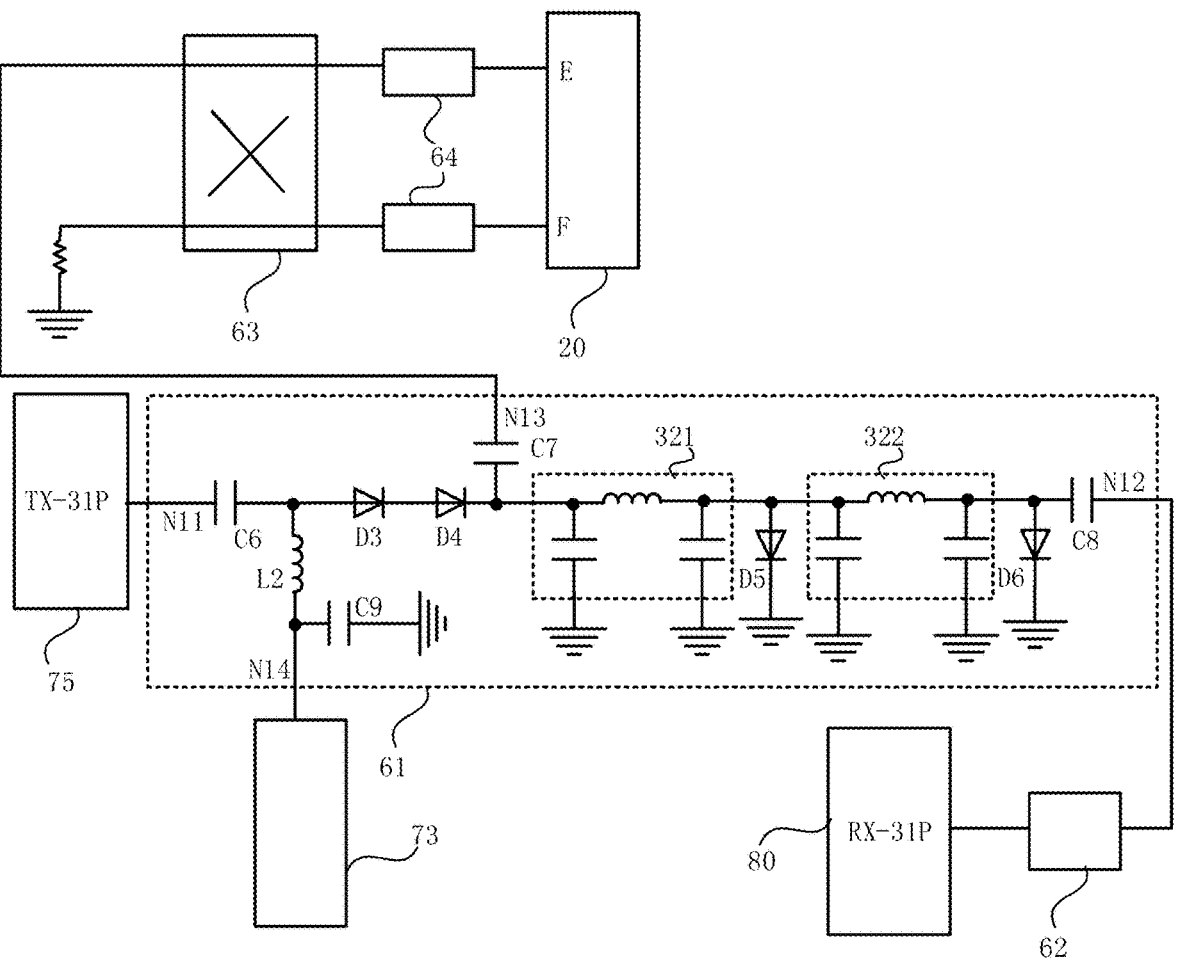
FIG. 8 is a schematic diagram of a circuit structure of a third front-end circuit according to an embodiment of the present application.
Figure 14:
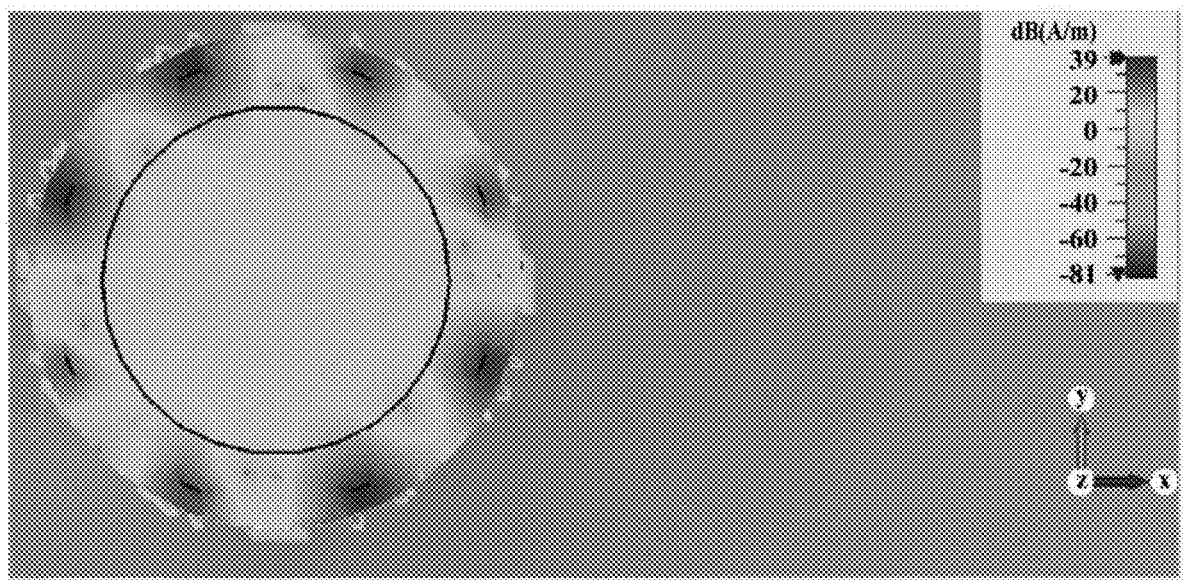
FIG. 14 is a 23Na magnetic field distribution diagram generated in a central region of a magnetic resonance multi-core radio frequency coil device according to an embodiment of the present application.

Based on the preceding embodiments, in an embodiment, FIG. 8 is a schematic diagram of a circuit structure of a third front-end circuit according to an embodiment of the present application. The magnetic resonance multi-core radio frequency coil device further includes a third front-end circuit. The third front-end circuit includes a third transmitting and receiving mode switch 61, a third low-noise amplifier 62, a second quadrature power divider 63, and a third balun structure 64.

A first terminal N11 of the third transmitting and receiving mode switch 61 is configured to receive an excitation signal at a frequency corresponding to the nuclide corresponding to the second birdcage coil 20; a second terminal N12 of the third transmitting and receiving mode switch 61 is electrically connected to an input terminal of the third low-noise amplifier 62; a third terminal N13 of the third transmitting and receiving mode switch 61 is electrically connected to an input terminal of the second quadrature power divider 63; two output terminals of the second quadrature power divider 63 are electrically connected to the second birdcage coil 20 through the third balun structure 64; and the third low-noise amplifier 62 is configured to output a magnetic resonance signal of the nuclide corresponding to the second birdcage coil 20.

In an embodiment, by connecting the first terminal N11 and the third terminal N13 of the third transmitting and receiving mode switch 61, and disconnecting the second terminal N12 and the third terminal N13 of the third transmitting and receiving mode switch 61, the second birdcage coil 20 enters the transmitting mode. In an embodiment, by disconnecting the first terminal N11 and the third terminal N13 of the third transmitting and receiving mode switch 61, and connecting the second terminal N12 and the third terminal N13 of the third transmitting and receiving mode switch 61, the second birdcage coil 20 enters the receiving mode. In the case where the second birdcage coil 20 is in the transmitting mode, the second quadrature power divider 63 can convert one signal inputted into the second quadrature power divider 63 into two equally divided signals with a phase difference of 90 degrees and output the two equally divided signals. The two output terminals of the second quadrature power divider 63 are separately electrically connected to two quadrature excitation ports E and F of the second birdcage coil 20 through the third balun structure 64.

In an embodiment, the first terminal of the third transmitting and receiving mode switch 61 may be electrically connected to an output terminal TX-31P of a fourth excitation signal source 75. The control circuit 73 may be electrically connected to a fourth terminal N14 of the third transmitting and receiving mode switch 61.

In conjunction with FIGS. 8 and 5, to make the second birdcage coil 20 transmit radio frequency energy, the control circuit 73 may input a high level such as +5V to the fourth terminal N14 of the third transmitting and receiving mode switch 61, and the diodes D3 and D4 in the third transmitting and receiving mode switch 61 is turned on so that the first terminal N11 and the third terminal N13 of the third transmitting and receiving mode switch 61 are connected and the second terminal N12 and the third terminal N13 are disconnected. At the same time, the 31P excitation signal comes out from the fourth excitation signal source 75, enters the third transmitting and receiving mode switch 61, passes through the first terminal N11 of the third transmitting and receiving mode switch 61, is transmitted to the third terminal N13, and enters the second quadrature power divider 63 so that the excitation signal generates two equally divided input signals with a phase difference of 90 degrees to form two quadrature excitation signals, and the two quadrature excitation signals enter the excitation ports E and F of the second birdcage coil 20, thereby achieving low-pass 31P birdcage quadrature excitation. To make the second birdcage coil 20 receive radio frequency energy, the control circuit 73 may input a low level such as −30V to the fourth terminal N14 of the third transmitting and receiving mode switch 61, the diodes D3 and D4 in the third transmitting and receiving mode switch 61 is turned off, the MRI signal comes out from the second birdcage coil 20 (31P resonator), the magnetic resonance signal is amplified through the third low-noise amplifier 62, and the amplified magnetic resonance signal is transmitted to a receiving terminal RX-31P of the image reconstruction module 80, thereby completing image reconstruction.

The first transmitting and receiving mode switch 32, the second transmitting and receiving mode switch 51, and the third transmitting and receiving mode switch 61 have the same or similar structures. In an embodiment, the control signal input terminal (TD5, TD6, TD7, or TD8 in FIG. 5) of the second tuning and detuning control circuit 23 may be electrically connected to the control circuit 73. The design of the transmitting and receiving mode switch corresponding to each nuclide is completed so that the transmitting and receiving states of the radio frequency coil are controlled, rapid switching between excitation and collection is achieved, and transmitting and receiving are performed in a time-sharing manner. The amplitude and phase of each channel excitation source are controlled through the power divider and the phase shifter, so as to form the quadrature excitation mode for the birdcage coil. Multiple independent tuning and detuning control circuits (for example, the first tuning and detuning control circuit 13, the second tuning and detuning control circuit 23, and the like) are configured to separately control the working states of different nuclide coils so that the interference between multiple nuclides of the inner birdcage and the outer birdcage is reduced, and the residual interference and shielding effects caused by copper components in other loops are reduced.

Based on the preceding embodiments, in an embodiment, with continued reference to FIG. 1, the magnetic resonance multi-core radio frequency coil device may further include a shielding layer 90. The shielding layer 90 may be located outside the first birdcage coil 10 and the second birdcage coil 20. The shielding layer 90 may be a pure copper shielding layer. For example, the shielding layer 90 may have a diameter of 20 cm, a length of 23 cm, and a thickness of 0.15 mm. The shielding layer 90 may be used for reducing the amplitude of interference signals and protecting the external radiation of radio frequency signals.

An embodiment of the present application provides a magnetic resonance imaging system. FIG. 9 is a structural diagram of a magnetic resonance imaging system according to an embodiment of the present application. Based on the preceding embodiments, the magnetic resonance imaging system includes the magnetic resonance multi-core radio frequency coil device provided in any embodiment of the present application.

In an embodiment, in FIGS. 6, 7, and 8, the magnetic resonance imaging system further includes the first excitation signal source 71, the second excitation signal source 72, the third excitation signal source 74, and the fourth excitation signal source 75. In an embodiment, in FIG. 9, the magnetic resonance imaging system further includes the image reconstruction module 80. The magnetic resonance imaging system is a magnetic resonance multi-core imaging system.

The magnetic resonance imaging system provided in the embodiment of the present application includes the magnetic resonance multi-core radio frequency coil device in the preceding embodiments. Therefore, the magnetic resonance imaging system provided in the embodiment of the present application also has the beneficial effects described in the embodiments of the magnetic resonance multi-core radio frequency coil device. The details are not repeated here.

An embodiment of the present application provides a control method. FIG. 10 is a flowchart of a control method according to an embodiment of the present application. The control method is performed based on the magnetic resonance multi-core radio frequency coil device provided in any embodiment of the present application. Based on the preceding embodiments, the control method includes the steps described below.

In step 710, in any scan cycle, a first birdcage coil transmits and receives radio frequency energy at frequencies corresponding to three different nuclides.

In the case where the first birdcage coil 10 is in the transmitting mode, the first birdcage coil 10 simultaneously transmits radio frequency energy at frequencies corresponding to three different nuclides; and in the case where the first birdcage coil 10 is in the receiving mode, the first birdcage coil 10 simultaneously receives the radio frequency energy at the frequencies corresponding to the three different nuclides, thereby improving the imaging speed and accuracy. The first birdcage coil 10 receives and transmits the radio frequency energy in a time-sharing manner. For example, in conjunction with FIGS. 6 and 7, the mode can be switched through the first transmitting and receiving mode switch 32 and the second transmitting and receiving mode switch 51.

In step 720, in any scan cycle, a second birdcage coil transmits and receives radio frequency energy at a frequency corresponding to a nuclide, where the first birdcage coil and the second birdcage coil operate in a time-sharing manner.

The second birdcage coil 20 receives and transmits the radio frequency energy in a time-sharing manner. For example, as shown in FIG. 8, the mode can be switched through the third transmitting and receiving mode switch 61. In any scan cycle, the first birdcage coil 10 and the second birdcage coil 20 operate in a time-sharing manner so that the electromagnetic interference between the inner birdcage coil and the outer birdcage coil is reduced.

In an embodiment, the first birdcage coil 10 and the second birdcage coil 20 operate in a time-sharing manner, which may be manifested in that the working time of the first birdcage coil 10 and the working time of the second birdcage coil 20 do not overlap. For example, in the case where the first birdcage coil 10 transmits and receives frequency energy, the second birdcage coil 20 is in the detuned state; and in the case where the second birdcage coil 20 transmits and receives the frequency energy, the first birdcage coil 10 is in the detuned state.

The control method provided in the embodiment of the present application is performed based on the magnetic resonance multi-core radio frequency coil device provided in any embodiment of the present application. Therefore, the control method provided in the embodiment of the present application also has the beneficial effects described in the preceding embodiments. The details are not repeated here.

An embodiment of the present application provides another control method. FIG. 11 is a flowchart of another control method according to an embodiment of the present application. Based on the preceding embodiments, the control method includes the steps described below.

In step 810, in any scan cycle, in the case where the first tuning and detuning control circuit controls the first birdcage coil to be in the tuned state, the first birdcage coil transmits and receives radio frequency energy at frequencies corresponding to three different nuclides; and the second tuning and detuning control circuit controls the second birdcage coil to be in the detuned state.

In FIG. 4, the first diode D1 in the first tuning and detuning control circuit 13 may be controlled to be turned on so that the first birdcage coil 10 is in the detuned state; and the first diode D1 in the first tuning and detuning control circuit 13 may be controlled to be turned off so that the first birdcage coil 10 is in the tuned state. In FIG. 5, the first diode D1 in the second tuning and detuning control circuit 23 may be controlled to be turned on so that the second birdcage coil 20 is in the detuned state; and the first diode D1 in the second tuning and detuning control circuit 23 may be controlled to be turned off so that the second birdcage coil 10 is in the tuned state.

In step 820, in any scan cycle, in the case where the second tuning and detuning control circuit controls the second birdcage coil to be in the tuned state, the second birdcage coil transmits and receives radio frequency energy at a frequency corresponding to a nuclide; and the first tuning and detuning control circuit controls the first birdcage coil to be in the detuned state.

The magnetic resonance multi-core radio frequency coil device in the embodiments of the present application is provided with an integrated four-band transceiver double-layer nested birdcage quadrature mode. 1H, 19F, 23Na, and 31P are used as examples to achieve a signal excitation and collection chain at frequencies required for quad-core imaging. The outer layer structure may be a four-terminal ring high-low-pass hybrid birdcage coil structure with three frequencies of 1H, 19F, and 23Na. The distance between the inner end ring and the outer end ring is adjusted and optimized, so as to deal with the interaction and electromagnetic interference between the three different nuclides. The inner layer structure may be a 31P high-pass birdcage structure. The tuning and detuning control circuits are introduced into the radio frequency link of the two birdcage structures, and the relative positions of the two birdcage coils are adjusted so that the electromagnetic coupling between the nuclide 31P in the inner layer and the nuclides 1H, 19F, and 23Na in the outer layer is reduced, and uniform excitation and collection of 1H, 19F, 31P, and 23Na signals in a region of interest are achieved. 1H imaging may be used to complete the shimming of a magnetic field B0, complete the excitation and collection of non-1H nuclides without repositioning, and provide anatomical, physiological, or metabolic images at the same time. A uniform B1 field can be provided within the region of interest, including at the coil isocenter.

For example, in FIG. 2, the diameter of the high-low-pass hybrid 8-leg 1H/19F/23Na nuclide four-terminal ring hybrid birdcage coil (first birdcage coil) 10 is 18 cm, which is equivalent to the following: the distance between the first outer end ring 11-1 and the second outer end ring 11-4 along the axial direction may be 18 cm, and the width of the wires for making the end rings and leg structures may be 8 mm. The second sub-birdcage coil 102 of the 23Na nuclide may adopt a low-pass structure, and the birdcage leg length of the second sub-birdcage coil 102 may be 13 cm, which is equivalent to the following: the distance between the first inner end ring 11-2 and the second inner end ring 11-3 along the axial direction may be 13 cm. The first sub-birdcage coil 101 of the 1H/19F nuclide may adopt a high-pass structure, and the birdcage leg length of the first sub-birdcage coil 101 may be 18 cm, which is equivalent to the following: the distance between the first outer end ring 11-1 and the first inner end ring 11-2 along the axial direction may be 25 mm, and the distance between the second inner end ring 11-3 and the second outer end ring 11-4 along the axial direction may be 25 mm. The 8-leg high-pass 31P birdcage coil (second birdcage coil) 20 may have a diameter of 18 cm, a leg length of 212 mm, and a thickness of 0.15 mm. To reduce the parasitic parameters and shielding effects caused by the outer 1H/19F/23Na four-terminal ring coil (first birdcage coil) 10, the inner 31P high-pass birdcage (second birdcage coil) 20 array deviates along the azimuth direction (along the circumferential direction W) by 45 degrees.

An embodiment of the present application further provides a computer-readable storage medium, which stores computer programs for performing the preceding method. The storage medium may be non-transitory.

All or part of the processes in the methods of the preceding embodiments may be implemented by related hardware executed by computer programs, these programs may be stored in a non-transitory computer-readable storage medium, and during the execution of these programs, the processes in the preceding method embodiments may be included. The non-transitory computer-readable storage medium may be a magnetic disk, an optical disk, a read-only memory (ROM), or a random-access memory (RAM).

Simulation experiments were conducted on the nested birdcage four-nuclide magnetic resonance radio frequency coil device in the embodiments of the present application, and the simulation experiments prove that the structure is feasible. A water load model is loaded onto the magnetic resonance multi-core radio frequency coil device (the water load model is used for simulating human tissues and may represent the imaging load), and the S parameter results of the magnetic resonance multi-core radio frequency coil device are shown in FIGS. 12 and 13. FIG. 12 is an S parameter distribution diagram of 1H, 19F, and 23Na of a first birdcage coil 10 according to an embodiment of the present application. FIG. 13 is an S parameter distribution diagram of 31P of a second birdcage coil 20 according to an embodiment of the present application. The horizontal axis represents the resonant frequency, and the vertical axis represents the reflection coefficient. The curve (S1, 1) in FIG. 12 is the S parameter distribution curve of 23Na; and the curve (S3, 3) in FIG. 12 is the S parameter distribution curve of 1H and 19F. As shown in mark 1 in FIG. 12, the reflection coefficient of 23Na is −13.17044 dB; as shown in mark 2 in FIG. 12, the reflection coefficient of 19F is −8.777925 dB; and as shown in mark 3 in FIG. 12, the reflection coefficient of 1H is −8.885005 dB. The curve in FIG. 13 is the S parameter distribution curve of 31P. As shown at mark 1 in FIG. 13, the reflection coefficient of 31P is −25.51067 dB. The simulation results prove that the magnetic resonance multi-core radio frequency coil device can generate four resonant frequencies of 1H (128.2 MHZ)/19F (120.6 MHz)/23Na (33.9 MHz)/31P (51.9 MHz). The nested birdcage magnetic resonance multi-core radio frequency coil device in the embodiments of the present application is feasible. In the case where the inner 31P birdcage coil (second birdcage coil) 20 is detuned, the outer four-terminal ring high-low-pass hybrid birdcage coil (first birdcage coil) 10 achieves simultaneous resonance of 1H, 19F, and 23Na nuclides. On the contrary, in the case where the outer 1H, 19F, and 23Na four-terminal ring high-low-pass hybrid birdcage coil (first birdcage coil) 10 is detuned, the inner 31P birdcage coil (second birdcage coil) 20 starts to operate, generating the resonant frequency of 31P.

Figure 15:
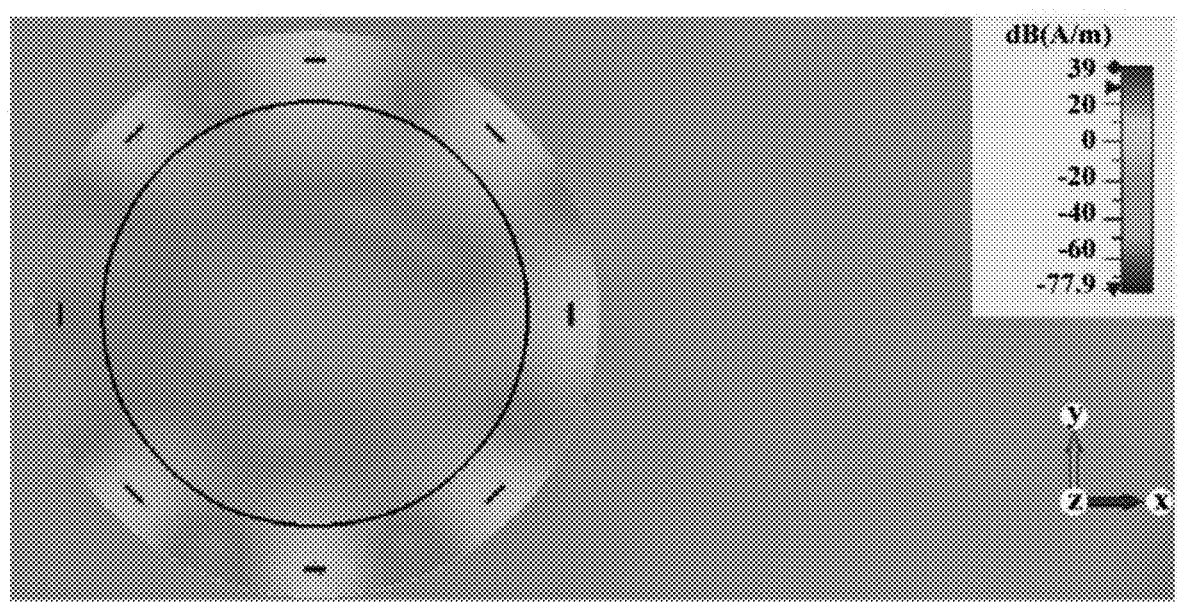
FIG. 15 is a 1H magnetic field distribution diagram generated in a central region of a magnetic resonance multi-core radio frequency coil device according to an embodiment of the present application.
Figure 16:
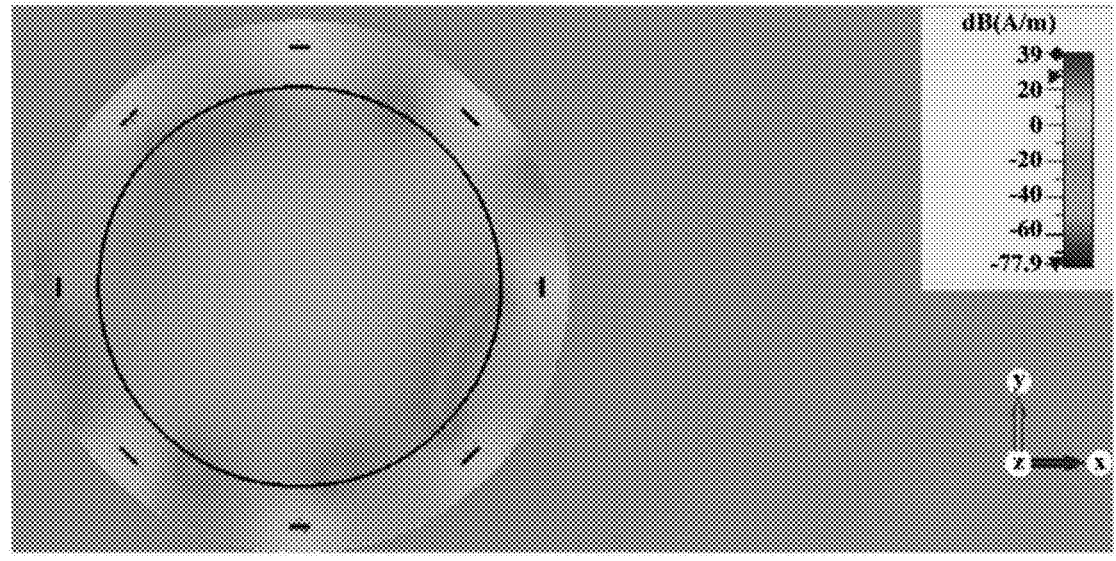
FIG. 16 is a 19F magnetic field distribution diagram generated in a central region of a magnetic resonance multi-core radio frequency coil device according to an embodiment of the present application.
Figure 17:
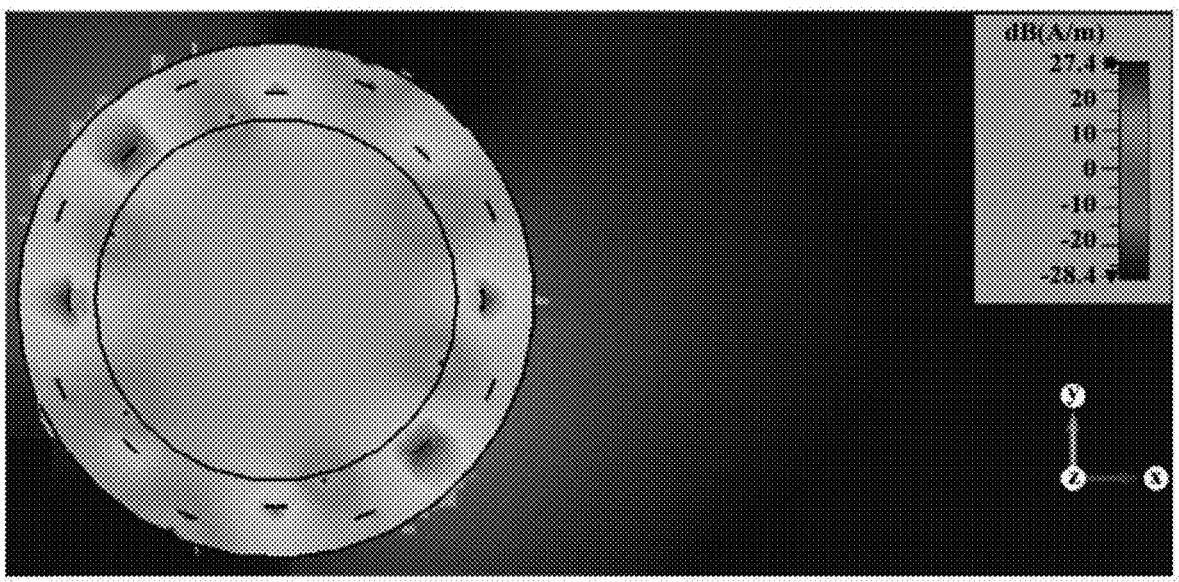
FIG. 17 is a 31P magnetic field distribution diagram generated in a central region of a magnetic resonance multi-core radio frequency coil device according to an embodiment of the present application.

The nested birdcage four-nuclide magnetic resonance radio frequency coil device generates relatively uniformly distributed magnetic fields in the central region. As shown in FIGS. 14, 15, 16, and 17, FIG. 14 is a 23Na magnetic field distribution diagram generated in a central region of a magnetic resonance multi-core radio frequency coil device according to an embodiment of the present application; FIG. 15 is a 1H magnetic field distribution diagram generated in a central region of a magnetic resonance multi-core radio frequency coil device according to an embodiment of the present application; FIG. 16 is a 19F magnetic field distribution diagram generated in a central region of a magnetic resonance multi-core radio frequency coil device according to an embodiment of the present application; and FIG. 17 is a 31P magnetic field distribution diagram generated in a central region of a magnetic resonance multi-core radio frequency coil device according to an embodiment of the present application. The directions X, Y, and Z may be perpendicular to each other.

In an embodiment, the first sub-birdcage coil 101 is configured to transmit and receive radio frequency energy at frequencies corresponding to two different nuclides, and the second sub-birdcage coil 102 is configured to transmit and receive radio frequency energy at a frequency corresponding to a nuclide. Compared to another embodiment in which the first sub-birdcage coil 101 is configured to transmit and receive radio frequency energy at a frequency corresponding to a nuclide and the second sub-birdcage coil 102 is configured to transmit and receive radio frequency energy at frequencies corresponding to two different nuclides, the simulation effect of the aforementioned embodiment is better.

Those skilled in the art can make various modifications, adaptations, combinations, and substitutions without departing from the scope of the present application. Therefore, although the present application is described through the preceding embodiments, the present application is not limited to the preceding embodiments and may also include more other equivalent embodiments without departing from the concept of the present disclosure.

What is claimed is:

1. A magnetic resonance multi-core radio frequency coil device, comprising a first birdcage coil and a second birdcage coil which are coaxially nested;

wherein the first birdcage coil comprises four first end rings arranged along an axial direction and a plurality of first leg structures extending along the axial direction and arranged along a circumferential direction; each of the plurality of first leg structures is connected to the four first end rings;

the second birdcage coil comprises two second end rings arranged along the axial direction and a plurality of second leg structures extending along the axial direction and arranged along the circumferential direction; and each of the plurality of second leg structures is connected to the two second end rings;

the first birdcage coil is configured to transmit and receive radio frequency energy at frequencies corresponding to three different nuclides; the second birdcage coil is configured to transmit and receive radio frequency energy at a frequency corresponding to a nuclide; and the nuclides corresponding to the first birdcage coil are different from the nuclide corresponding to the second birdcage coil;

the first birdcage coil is provided with a first tuning and detuning control circuit; and the second birdcage coil is provided with a second tuning and detuning control circuit; and the first tuning and detuning control circuit and the second tuning and detuning control circuit are configured in the following manners:

in response to the first tuning and detuning control circuit being configured to control the first birdcage coil to be in a tuned state, the second tuning and detuning control circuit is configured to control the second birdcage coil to be in a detuned state; and in response to the second tuning and detuning control circuit being configured to control the second birdcage coil to be in the tuned state, the first tuning and detuning control circuit is configured to control the first birdcage coil to be in the detuned state.

2. The magnetic resonance multi-core radio frequency coil device of claim 1, wherein the four first end rings comprise a first outer end ring, a first inner end ring, a second inner end ring, and a second outer end ring arranged in sequence along the axial direction;

the first outer end ring, the second outer end ring, and the plurality of first leg structures between the first outer end ring and the second outer end ring form a first sub-birdcage coil;

the first inner end ring, the second inner end ring, and a portion of each of the plurality of first leg structures between the first inner end ring and the second inner end ring form a second sub-birdcage coil;

the first sub-birdcage coil is configured to transmit and receive radio frequency energy of frequencies corresponding to two different nuclides of the three different nuclides; the second sub-birdcage coil is configured to transmit and receive radio frequency energy of a frequency corresponding to a nuclide of the three different nuclides; and the two nuclides corresponding to the first sub-birdcage coil are different from the nuclide corresponding to the second sub-birdcage coil.

3. The magnetic resonance multi-core radio frequency coil device of claim 2, further comprising a power combiner, a first transmitting and receiving mode switch, a first low-noise amplifier, a low-pass filter, a high-pass filter, a power divider, a 90-degree phase shifter, a first balun structure, and a double resonant circuit;

wherein the power combiner is configured to simultaneously receive excitation signals at frequencies corresponding to the two different nuclides; an output terminal of the power combiner is electrically connected to a first terminal of the first transmitting and receiving mode switch; a second terminal of the first transmitting and receiving mode switch is electrically connected to an input terminal of the first low-noise amplifier; a third terminal of the first transmitting and receiving mode switch is electrically connected to an input terminal of the power divider;

a first output terminal of the power divider is electrically connected to the first sub-birdcage coil through the 90-degree phase shifter, the first balun structure, and the double resonant circuit in sequence; a second output terminal of the power divider is electrically connected to the first sub-birdcage coil through the first balun structure and the double resonant circuit in sequence;

an input terminal of the low-pass filter and an input terminal of the high-pass filter are separately electrically connected to an output terminal of the first low-noise amplifier;

the low-pass filter is configured to output a magnetic resonance signal of one nuclide of the two different nuclides; and the high-pass filter is configured to output a magnetic resonance signal of another nuclide of the two different nuclides.

4. The magnetic resonance multi-core radio frequency coil device of claim 2, further comprising a second transmitting and receiving mode switch, a second low-noise amplifier, a first quadrature power divider, and a second balun structure;

wherein a first terminal of the second transmitting and receiving mode switch is configured to receive an excitation signal at a frequency corresponding to the nuclide corresponding to the second sub-birdcage coil; a second terminal of the second transmitting and receiving mode switch is electrically connected to an input terminal of the second low-noise amplifier; a third terminal of the second transmitting and receiving mode switch is electrically connected to an input terminal of the first quadrature power divider;

two output terminals of the first quadrature power divider are electrically connected to the second sub-birdcage coil through the second balun structure; and the second low-noise amplifier is configured to output a magnetic resonance signal of the nuclide corresponding to the second sub-birdcage coil.

5. The magnetic resonance multi-core radio frequency coil device of claim 2, wherein the first sub-birdcage coil is configured to transmit and receive radio frequency energy at frequencies corresponding to $^{1}$H and $^{19}$F; the second sub-birdcage coil is configured to transmit and receive radio frequency energy at a frequency corresponding to $^{23}$Na; and the second birdcage coil is configured to transmit and receive radio frequency energy at a frequency corresponding to $^{31}$P.

6. The magnetic resonance multi-core radio frequency coil device of claim 1, further comprising a third transmitting and receiving mode switch, a third low-noise amplifier, a second quadrature power divider, and a third balun structure;

wherein a first terminal of the third transmitting and receiving mode switch is configured to receive an excitation signal at a frequency corresponding to the nuclide corresponding to the second birdcage coil; a second terminal of the third transmitting and receiving mode switch is electrically connected to an input terminal of the third low-noise amplifier; a third terminal of the third transmitting and receiving mode switch is electrically connected to an input terminal of the second quadrature power divider;

two output terminals of the second quadrature power divider are electrically connected to the second birdcage coil through the third balun structure; and the third low-noise amplifier is configured to output a magnetic resonance signal of the nuclide corresponding to the second birdcage coil.

7. A control method based on a magnetic resonance multi-core radio frequency coil device, wherein the magnetic resonance multi-core radio frequency coil device comprises a first birdcage coil and a second birdcage coil which are coaxially nested;

the first birdcage coil comprises four first end rings arranged along an axial direction and a plurality of first leg structures extending along the axial direction and arranged along a circumferential direction; each of the plurality of first leg structures is connected to the four first end rings;

the second birdcage coil comprises two second end rings arranged along the axial direction and a plurality of second leg structures extending along the axial direction and arranged along the circumferential direction; and each of the plurality of second leg structures is connected to the two second end rings; and the first birdcage coil is configured to transmit and receive radio frequency energy at frequencies corresponding to three different nuclides; the second birdcage coil is configured to transmit and receive radio frequency energy at a frequency corresponding to a nuclide; and the nuclides corresponding to the first birdcage coil are different from the nuclide corresponding to the second birdcage coil;

wherein the control method comprises:

in any scan cycle, transmitting and receiving, by a first birdcage coil, radio frequency energy at frequencies corresponding to three different nuclides; and in any scan cycle, transmitting and receiving, by a second birdcage coil, radio frequency energy at a frequency corresponding to a nuclide, wherein the first birdcage coil and the second birdcage coil operate in a time-sharing manner.

8. The control method of claim 7, wherein in any scan cycle, transmitting and receiving, by the first birdcage coil, the radio frequency energy at the frequencies corresponding to the three different nuclides comprises:

in any scan cycle, in response to a first tuning and detuning control circuit controlling the first birdcage coil to be in a tuned state, transmitting and receiving, by the first birdcage coil, the radio frequency energy at the frequencies corresponding to the three different nuclides; and controlling, by a second tuning and detuning control circuit, the second birdcage coil to be in a detuned state;

wherein in any scan cycle, transmitting and receiving, by the second birdcage coil, the radio frequency energy at the frequency corresponding to the nuclide comprises:

in any scan cycle, in response to the second tuning and detuning control circuit controlling the second birdcage coil to be in the tuned state, transmitting and receiving, by the second birdcage coil, the radio frequency energy corresponding to the nuclide; and controlling, by the first tuning and detuning control circuit, the first birdcage coil to be in the detuned state.

9. The control method of claim 7, wherein in any scan cycle, transmitting and receiving, by the first birdcage coil, the radio frequency energy at the frequencies corresponding to the three different nuclides comprises:

in any scan cycle, in response to a first tuning and detuning control circuit controlling the first birdcage coil to be in a tuned state, transmitting and receiving, by the first birdcage coil, the radio frequency energy at the frequencies corresponding to the three different nuclides; and controlling, by a second tuning and detuning control circuit, the second birdcage coil to be in a detuned state.

10. The control method of claim 7, wherein in any scan cycle, transmitting and receiving, by the second birdcage coil, the radio frequency energy at the frequency corresponding to the nuclide comprises:

in any scan cycle, in response to a second tuning and detuning control circuit controlling the second birdcage coil to be in a tuned state, transmitting and receiving, by the second birdcage coil, the radio frequency energy at the frequency corresponding to the nuclide; and controlling, by a first tuning and detuning control circuit, the first birdcage coil to be in a detuned state.

11. A non-transitory computer-readable storage medium, which stores computer programs for performing the control method of claim 7 when the computer programs are executed by a processor.

12. The non-transitory computer-readable storage medium of claim 11, wherein in any scan cycle, transmitting and receiving, by the first birdcage coil, the radio frequency energy at the frequencies corresponding to the three different nuclides comprises:

in any scan cycle, in response to a first tuning and detuning control circuit controlling the first birdcage coil to be in a tuned state, transmitting and receiving, by the first birdcage coil, the radio frequency energy at the frequencies corresponding to the three different nuclides; and controlling, by a second tuning and detuning control circuit, the second birdcage coil to be in a detuned state;

wherein in any scan cycle, transmitting and receiving, by the second birdcage coil, the radio frequency energy at the frequency corresponding to the nuclide comprises:

in any scan cycle, in response to the second tuning and detuning control circuit controlling the second birdcage coil to be in the tuned state, transmitting and receiving, by the second birdcage coil, the radio frequency energy at the frequency corresponding to the nuclide; and controlling, by the first tuning and detuning control circuit, the first birdcage coil to be in the detuned state.

13. The non-transitory computer-readable storage medium of claim 11, wherein in any scan cycle, transmitting and receiving, by the first birdcage coil, the radio frequency energy at the frequencies corresponding to the three different nuclides comprises:

in any scan cycle, in response to a first tuning and detuning control circuit controlling the first birdcage coil to be in a tuned state, transmitting and receiving, by the first birdcage coil, the radio frequency energy at the frequencies corresponding to the three different nuclides; and controlling, by a second tuning and detuning control circuit, the second birdcage coil to be in a detuned state.

14. The non-transitory computer-readable storage medium of claim 11, wherein in any scan cycle, transmitting and receiving, by the second birdcage coil, the radio frequency energy at the frequency corresponding to the nuclide comprises:

in any scan cycle, in response to a second tuning and detuning control circuit controlling the second birdcage coil to be in a tuned state, transmitting and receiving, by the second birdcage coil, the radio frequency energy at the frequency corresponding to the nuclide; and controlling, by a first tuning and detuning control circuit, the first birdcage coil to be in a detuned state.

* * * * *